(12) United States Patent
Takagi et al.

(10) Patent No.: US 10,107,553 B2
(45) Date of Patent: Oct. 23, 2018

(54) HEAT EXCHANGER

(71) Applicant: DENSO CORPORATION, Kariya, Aichi-pref. (JP)

(72) Inventors: Yuusuke Takagi, Kariya (JP); Yasuhiro Mizuno, Kariya (JP)

(73) Assignee: DENSO CORPORATION, Kariya, Aichi-pref. (JP)

( * ) Notice: Subject to any disclaimer, the term of this patent is extended or adjusted under 35 U.S.C. 154(b) by 0 days.

(21) Appl. No.: 15/566,589

(22) PCT Filed: Apr. 11, 2016

(86) PCT No.: PCT/JP2016/001972
§ 371 (c)(1),
(2) Date: Oct. 13, 2017

(87) PCT Pub. No.: WO2016/166963
PCT Pub. Date: Oct. 20, 2016

(65) Prior Publication Data
US 2018/0112933 A1    Apr. 26, 2018

(30) Foreign Application Priority Data

Apr. 17, 2015  (JP) .................................. 2015-085241
Mar. 15, 2016  (JP) .................................. 2016-051273

(51) Int. Cl.
*F28D 7/00* (2006.01)
*F28D 1/053* (2006.01)

(52) U.S. Cl.
CPC .............................. *F28D 1/05325* (2013.01)

(58) Field of Classification Search
CPC ... F28D 1/05325; F28D 1/0535; F28D 1/0477
(Continued)

(56) References Cited

U.S. PATENT DOCUMENTS 3,473,210 A * 10/1969 Klank .................... B21D 53/04
29/281.1
4,615,384 A * 10/1986 Shimada ................. F28F 1/128
165/152

(Continued)

FOREIGN PATENT DOCUMENTS

JP    S54115654 U    8/1979
JP    S63189784 A    8/1988
(Continued)

*Primary Examiner* — Claire Rojohn, III
(74) *Attorney, Agent, or Firm* — Harness, Dickey & Pierce, P.L.C.

(57) ABSTRACT

A heat exchanger includes a flow passage pipe that has a flat shape having a predetermined thickness, a heat medium flowing in the flow passage pipe, the heat medium exchanging heat with a heat exchange target, and an inner fin located inside the flow passage pipe. The inner fin includes a wavy fin that partitions a main passage into multiple partitioned passages, and a guide wall connected to the wavy fin. An x-direction is a lengthwise direction of the flow passage pipe, a z-direction is a thickness direction of the flow passage pipe, and a y-direction is a direction perpendicular to both the x-direction and the z-direction. The wavy fin includes a first convex portion convex to a first side in the y-direction, and a second convex portion convex to a second side in the y-direction. The wavy fin has an opening portion through which two partitioned passages adjacent to each other communicate with each other. The guide wall protrudes from the wavy fin into the partitioned passage. The heat exchanger is capable of enhancing a heat transfer and improving a thermal performance of the heat exchanger.

12 Claims, 13 Drawing Sheets

(58) Field of Classification Search
USPC .......................................................... 165/159
See application file for complete search history.

(56) References Cited

U.S. PATENT DOCUMENTS

| | | | | |
|---|---|---|---|---|
| 4,621,687 | A * | 11/1986 | Ikuta | F28F 1/128 165/152 |
| 4,756,362 | A * | 7/1988 | Kudoh | F28D 1/0478 165/151 |
| 4,899,808 | A | 2/1990 | Gregory et al. | |
| 5,517,757 | A * | 5/1996 | Hayashi | B60H 1/3227 165/153 |
| 5,722,485 | A * | 3/1998 | Love | F28F 1/325 165/151 |
| 5,752,567 | A * | 5/1998 | Obosu | F28F 1/325 165/151 |
| 6,302,195 | B1 * | 10/2001 | Kataoka | F28D 1/0391 165/134.1 |
| 6,401,809 | B1 * | 6/2002 | Zhang | F28F 1/128 165/111 |
| 6,543,527 | B1 * | 4/2003 | Bouzida | F28F 1/128 165/152 |
| 6,883,598 | B2 * | 4/2005 | Sandberg | F28F 1/128 165/151 |
| 8,210,505 | B2 * | 7/2012 | Thonnelier | B01J 19/30 261/112.2 |
| 9,818,673 | B2 * | 11/2017 | Mizuno | H01L 23/473 |
| 9,960,100 | B2 * | 5/2018 | Arai | H01L 23/473 |
| 2003/0136554 | A1 * | 7/2003 | Hu | F28F 1/128 165/151 |
| 2004/0173344 | A1 * | 9/2004 | Averous | B01J 19/249 165/173 |
| 2004/0206484 | A1 * | 10/2004 | Shimoya | F28D 1/05383 165/152 |
| 2005/0121173 | A1 * | 6/2005 | Inagaki | F28D 1/0325 165/80.3 |
| 2006/0219396 | A1 * | 10/2006 | Abei | F28D 1/0333 165/164 |
| 2007/0240865 | A1 * | 10/2007 | Zhang | F28D 1/0341 165/152 |
| 2008/0190589 | A1 * | 8/2008 | Kramer | F28F 1/128 165/152 |
| 2009/0173479 | A1 * | 7/2009 | Huang | F28F 1/128 165/152 |
| 2010/0243226 | A1 * | 9/2010 | Huazhao | F28F 1/128 165/182 |
| 2011/0139428 | A1 * | 6/2011 | Kim | F28F 1/128 165/181 |
| 2011/0284197 | A1 * | 11/2011 | Sugimoto | F28D 1/0333 165/185 |
| 2011/0315362 | A1 * | 12/2011 | Jiang | F28D 1/05375 165/173 |
| 2012/0024511 | A1 * | 2/2012 | Harada | F02B 29/0456 165/181 |
| 2012/0031593 | A1 * | 2/2012 | Uno | F28D 9/0043 165/148 |
| 2017/0051982 | A1 | 2/2017 | Takami et al. | |

FOREIGN PATENT DOCUMENTS

| | | |
|---|---|---|
| JP | 2002350083 A | 12/2002 |
| JP | 2012009826 A | 1/2012 |
| JP | 2012017943 A | 1/2012 |
| JP | 2015227770 A | 12/2015 |

* cited by examiner

CROSSWISE DIRECTION
LENGTHWISE DIRECTION

COMPARATIVE EXAMPLE

HEAT EXCHANGER

CROSS REFERENCE TO RELATED APPLICATIONS

This application is a U.S. National Phase Application under 35 U.S.C. 371 of International Application No. PCT/JP2016/001972 filed on Apr. 11, 2016 and published in Japanese as WO 2016/166963 A1 on Oct. 20, 2016. This application is based on and claims the benefit of priority from Japanese Patent Applications No. 2015-085241 filed on Apr. 17, 2015, and No. 2016-051273 filed on Mar. 15, 2016. The entire disclosures of all of the above applications are incorporated herein by reference.

TECHNICAL FIELD

The present disclosure relates to a heat exchanger having a wavy fin.

BACKGROUND ART

Conventionally, a heat exchanger is known, in which flow passage pipes hold both sides of a heating element to dissipate a heat of the heating element such as a semiconductor module including a semiconductor element. In such heat exchanger, the heating elements and the flow passage pipes are stacked alternately with each other, and multiple flow passage pipes are communicated with each other by communication members such that a cooling medium flows in each of the flow passage pipes.

In order to improve a thermal performance of heat exchange of such heat exchanger, a configuration is disclosed, in which a partitioning member is provided in the flow passage pipe to partition one flow passage pipe in a thickness direction of the flow passage pipe into two heat medium passages. An inner fin is provided in each of the two heat medium passages.

In a heat exchanger disclosed in Patent Document 1, a wavy fin is used for increasing an area for heat transfer, for example.

PRIOR ART DOCUMENT

Patent Document

Patent Document 1: JP 2012-9826 A

SUMMARY OF THE INVENTION

It is an objective of the present disclosure to improve a thermal performance of a heat exchanger.

A heat exchanger according to a first aspect of the present disclosure includes: a flow passage pipe that has a flat shape having a predetermined thickness, a heat medium flowing in the flow passage pipe, the heat medium exchanging heat with a heat exchange target; and an inner fin that is located inside the flow passage pipe, the inner fin increasing an area for heat transfer between the heat exchange target and the heat medium. The inner fin includes: a wavy fin that partitions a main passage into multiple partitioned passages, the heat medium flowing in the main passage; and a guide wall connected to the wavy fin. An x-direction is a lengthwise direction of the flow passage pipe, a z-direction is a thickness direction of the flow passage pipe, and a y-direction is a direction perpendicular to both the x-direction and the z-direction. The wavy fin includes: first convex portions that are curved toward a first side in the y-direction; and second convex portions that are curved toward a second side in the y-direction. The first convex portions and the second convex portions are arranged in alternating manner and interconnected by intermediate portions so as to have a wavy shape in cross-section perpendicular to the z-direction. The wavy fin has an opening portion through which two partitioned passages of the multiple partitioned passages adjacent to each other across the wavy fin communicate with each other. The guide wall is connected to an edge of the wavy fin defining a downstream side of the opening portion in flow of the heat medium in the plurality of partitioned passages, the guide wall protruding from the wavy fin into the plurality of partitioned passages, an end of the guide wall facing upstream in flow of the heat medium in the plurality of partitioned passages. Alternatively, the guide wall is connected to an edge of the wavy fin defining an upstream side of the opening portion in flow of the heat medium in the plurality of partitioned passages, the guide wall protruding from the wavy fin into the plurality of partitioned passages, an end of the guide wall facing downstream in flow of the heat medium in the plurality of partitioned passages.

A heat exchanger according to a second aspect of the present disclosure includes: a flow passage pipe that has a flat shape having a predetermined thickness, a heat medium flowing in the flow passage pipe, the heat medium exchanging heat with a heat exchange target; and an inner fin that is located inside the flow passage pipe, the inner fin increasing an area for heat transfer between the heat exchange target and the heat medium. The inner fin includes: a wavy fin that partitions a main passage into multiple partitioned passages, the heat medium flowing in the main passage; and a guide wall connected to the wavy fin. An x-direction is a lengthwise direction of the flow passage pipe, a z-direction is a thickness direction of the flow passage pipe, and a y-direction is a direction perpendicular to both the x-direction and the z-direction. The wavy fin includes: first convex portions that are curved toward a first side in the y-direction; and second convex portions that are curved toward a second side in the y-direction. The first convex portions and the second convex portions are arranged in alternating manner and interconnected by intermediate portions so as to have a wavy shape in cross-section perpendicular to the z-direction. The wavy fin has an opening portion through which two partitioned passages of the multiple partitioned passages adjacent to each other across the wavy fin communicate with each other. The guide wall protrudes into the partitioned passage from an edge of the wavy fin defining a downstream side or an upstream side of the opening portion.

According to this, when the edge of the guide wall faces to the upstream side of the flow of the heat medium, the heat medium hits against the edge of the guide wall. Accordingly, a heat transfer is enhanced, and a thermal performance of the heat exchanger can be improved.

Since the guide wall is connected to the end of the wavy fin defining the downstream side of the opening portion in flow of the heat medium and protrudes into the partitioned passage, a part of the heat medium flowing in the narrow passage flows into the adjacent passage through the opening portion, and accordingly the separation in the narrow passage around the wavy fin can be limited. Accordingly, the thermal performance of the heat exchanger can be improved.

When the end of the guide wall faces downstream in flow of the heat medium, a part of the heat medium flowing in the narrow passage flows into the adjacent narrow passage through the opening portion, and accordingly the separation can be limited and the thermal performance of the heat exchanger can be improved.

Numerals of elements enclosed in parentheses indicate examples of correspondence relationships with the specific parts described in the embodiments below.

EMBODIMENTS FOR EXPLOITATION OF THE INVENTION

Figure 1:
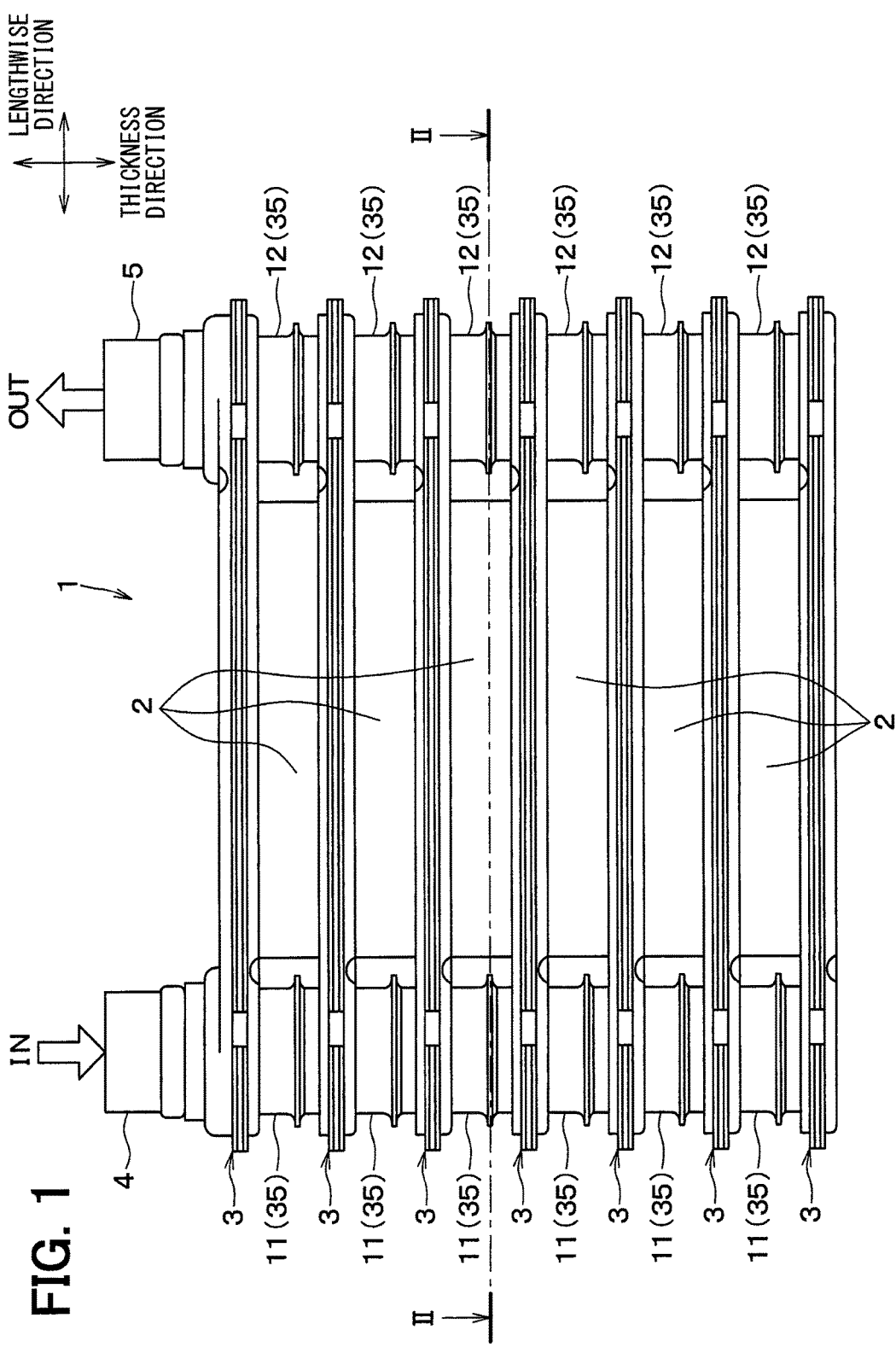
FIG. 1 is a front view illustrating a stacking-type heat exchanger according to a first embodiment.

Hereinafter, multiple embodiments for implementing the present disclosure will be described referring to drawings. In the respective embodiments, a part that corresponds to a matter described in a preceding embodiment may be assigned the same reference numeral, and redundant explanation for the part may be omitted. When only a part of a configuration is described in an embodiment, another preceding embodiment may be applied to the other parts of the configuration. The parts may be combined even if it is not explicitly described that the parts can be combined. The embodiments may be partially combined even if it is not explicitly described that the embodiments can be combined, provided there is no harm in the combination.

Hereinafter, embodiments of the present disclosure will be described referring to drawings. In the embodiments below, parts that are same as or equivalent to matters described in a preceding embodiment may be assigned the same reference numerals.

First Embodiment

A first embodiment of the present disclosure will be described referring to FIGS. 1 to 14. An example where a stacking-type heat exchanger 1 of the present embodiment constitutes a cooling device that cools multiple electronic components 2 as heat exchange targets will be described. The stacking-type heat exchanger 1 of the present embodiment may be used for other purposes. Moreover, the stacking-type heat exchanger 1 of the present embodiment may be used for heating. The electronic component 2 is a power card used in an inverter circuit that outputs three-phase voltage to a drive motor, for example. The stacking-type heat exchanger 1 corresponds to a heat exchanger.

The stacking-type heat exchanger 1 includes a flow passage pipe 3 and an inner fin 34 provided in the flow passage pipe 3. As shown in FIG. 1, multiple flow passage pipes 3 are stacked with each other in the stacking-type heat exchanger 1, and the electronic component 2 is provided in a gap between adjacent flow passage pipes 3.

Figure 2:
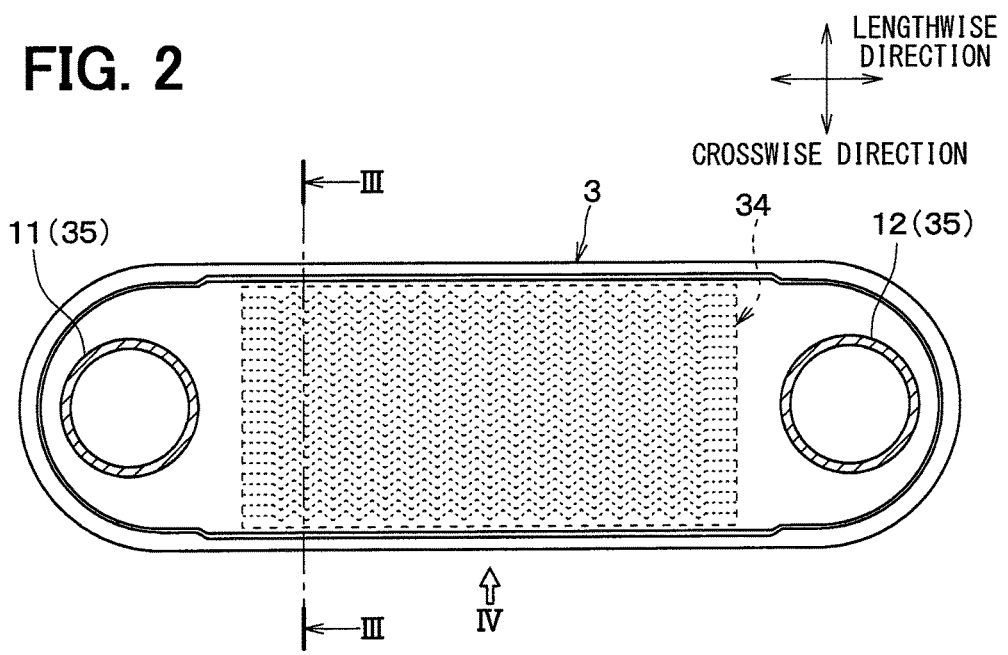
FIG. 2 is a cross-sectional view taken along II-II line of FIG. 1.
Figure 3:
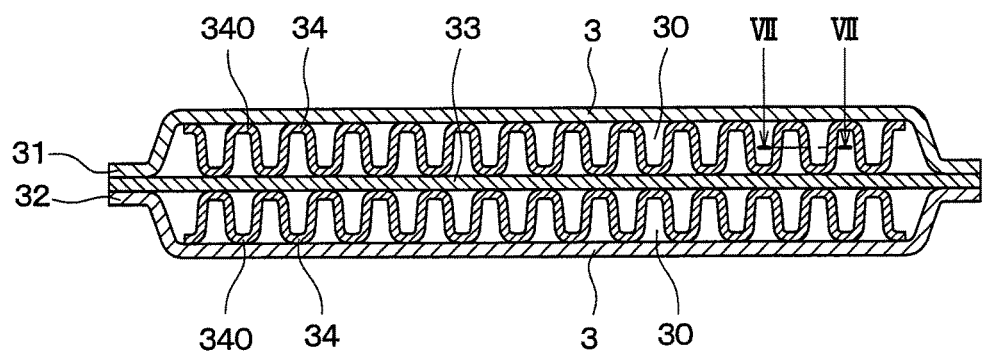
FIG. 3 is a cross-sectional view taken along III-III line of FIG. 2.

A heat medium that exchanges heat with the electronic component 2 flows in the flow passage pipe 3. A mixture of water and an ethylene glycol based antifreeze, a natural refrigerant such as water and ammonia, or the like can be used as the heat medium. A crosswise direction (second direction) of the flow passage pipe 3 is a direction perpendicular to both a lengthwise direction of the flow passage pipe 3 and a direction in which the flow passage pipes 3 are stacked with each other (stacking direction). As shown in FIG. 2, a pair of peripheral portions of the flow passage pipe 3 in the crosswise direction extends along and in parallel with the lengthwise direction (first direction), and peripheral end portions in the lengthwise direction of the flow passage pipe 3 have a semicircle shape. The stacking direction of the flow passage pipe 3 is a thickness direction (third direction) of the flow passage pipe 3. As shown in FIG. 3, the flow passage pipe 3 has a flat shape, and a cross-section of the flow passage perpendicular to the lengthwise direction has a predetermined thickness. The lengthwise direction of the flow passage pipe 3 corresponds to an x-direction. The crosswise direction corresponds to a y-direction. The thickness direction of the flow passage pipe 3 corresponds to a z-direction.

FIG. 2 is a cross-sectional diagram taken along II-II line of FIG. 1, but the electronic component 2 is omitted for clearly illustrating the shape of the flow passage pipe 3. In FIG. 2, the inner fin 34 provided in the flow passage pipe 3 is indicated by a dot-line. In FIGS. 2, 3, 5, 6, an opening portion 36 and a guide wall 37 which will be described later are omitted.

The flow passage pipe 3 is formed by stacking metal plates which have high thermal conductivities such as aluminum, copper, or the like and by bonding the metal plates with each other. As shown in FIG. 3, the flow passage pipe 3 includes outer plates 31, 32 and an inner plate 33.

The outer plates 31, 32 are plate members that constitute an outline of the flow passage pipe 3, and a heat exchange between the electronic component 2 and the heat medium is performed through the outer plates 31, 32. The inner plate 33 is constituted by a plate member having a rectangular shape, and the inner plate 33 is provided between the outer plates 31, 32 so as to face to both of the outer plates 31, 32. An opening portion having a circular shape is provided in both end portions of the inner plate 33 in the lengthwise direction of the flow passage pipe flow passage pipe 3, the opening portion of the inner plate 33 corresponding to an opening portion of a protruding pipe portion 35.

A heat medium passage 30 through which the heat medium flows is defined between the outer plates 31, 32 and the inner plate 33. The inner fin 34 is provided between the outer plate 31 and the inner plate 33, and between the outer plate 32 and the inner plate 33. The heat medium passage 30 that is a main passage is partitioned into multiple narrow passages (partitioned passages) by a first fin 340 and a second fin 341.

The inner fin 34 increases an area for heat transfer between the heat medium and the electronic component 2. The inner fin 34 is made from a plate of metal having a high thermal conductivity such as aluminum by pressing, for example.

In the flow passage pipe 3, the inner fins 34 are provided between the outer plate 31 and the inner plate 33, and between the outer plate 32 and the inner plate 33, and an inside of the peripheral portions of the outer plates 31, 32 and the inner plate 33 are bonded by brazing filler metal. The inner fins 34 are bonded to the outer plates 31, 32 by brazing filler metal.

According to this configuration, when the electronic component 2 is positioned in the gap between two flow passage pipes 3 during manufacturing the stacking-type heat exchanger 1, a deformation of the flow passage pipe 3 caused by a force exerted from an outside in the stacking direction can be limited. The peripheral portion of the inner plate 33 may be interposed between the outer plates 31, 32.

Figure 4:
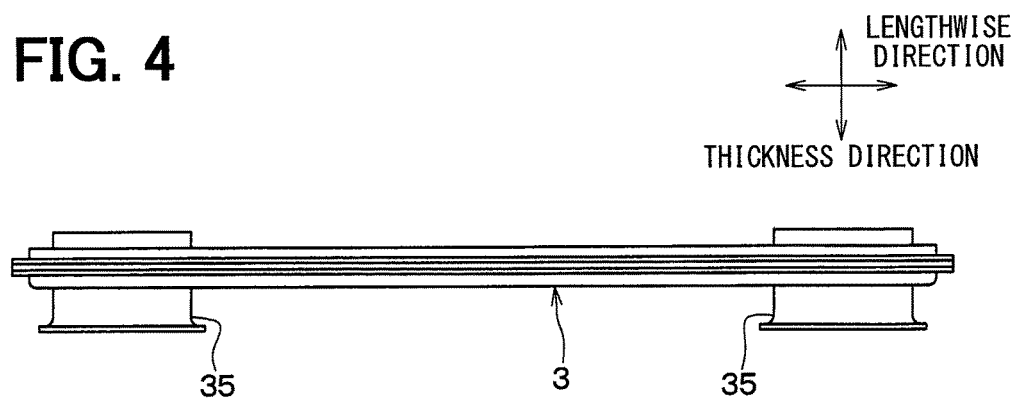
FIG. 4 is a diagram illustrating a flow passage pipe viewed along an arrow IV of FIG. 2.

As shown in FIG. 2, the protruding pipe portion 35 is provided on both ends of the flow passage pipe 3 in the lengthwise direction. The stacking-type heat exchanger 1 includes the protruding pipe portion 35. The protruding pipe portion 35 is a pipe that connects adjacent flow passage pipes 3 with each other. As shown in FIG. 4, the protruding pipe portion 35 is open in the stacking direction of the flow passage pipe 3 and has a circular cylindrical shape protruding in the stacking direction of the flow passage pipe 3. The flow passage pipes 3 excepting outermost one in the stacking direction include the protruding pipe portion 35 on both sides in the stacking direction. In contrast, the outermost one of multiple flow passage pipes 3 in the stacking direction includes the protruding pipe portion 35 on one side that faces the adjacent flow passage pipe 3. Multiple flow passage pipes 3 are joined with each other by engaging the protruding pipe portions 35 with each other and bonding lateral walls of the protruding pipe portions 35 to each other. According to this, the flow passage pipes 3 next to each other communicate with each other.

One of the protruding pipe portions 35 provided in both ends of the flow passage pipe 3 in the lengthwise direction is a supply header portion 11, and the other one is a discharge header portion 12. The supply header portion 11 is a pipe for supplying the heat medium to the heat medium passage 30 of the flow passage pipe 3, and the discharge header portion 12 is a pipe for discharging the heat medium from the heat medium passage 30 of the flow passage pipe 3.

As shown in FIG. 1, one of the flow passage pipes 3 located outermost in multiple flow passage pipes 3 with respect to the stacking direction is connected to a heat medium introduction portion 4 and a heat medium discharge portion 5. The heat medium introduction portion 4 is a pipe for introducing the heat medium to the stacking-type heat exchanger 1, and the heat medium discharge portion 5 is a pipe for discharging the heat medium from the stacking-type heat exchanger 1. The heat medium introduction portion 4 and the heat medium discharge portion 5 are joined with the flow passage pipe 3 by a bonding method such as brazing. The stacking-type heat exchanger 1 includes the heat medium introduction portion 4 and the heat medium discharge portion 5.

The heat medium is supplied to the stacking-type heat exchanger 1 by a pump through the heat medium introduction portion 4, and the heat medium is discharged from the stacking-type heat exchanger 1 through the heat medium discharge portion 5. A flow rate of the heat medium in the stacking-type heat exchanger 1 is controlled to be constant by the pump.

Figure 5:
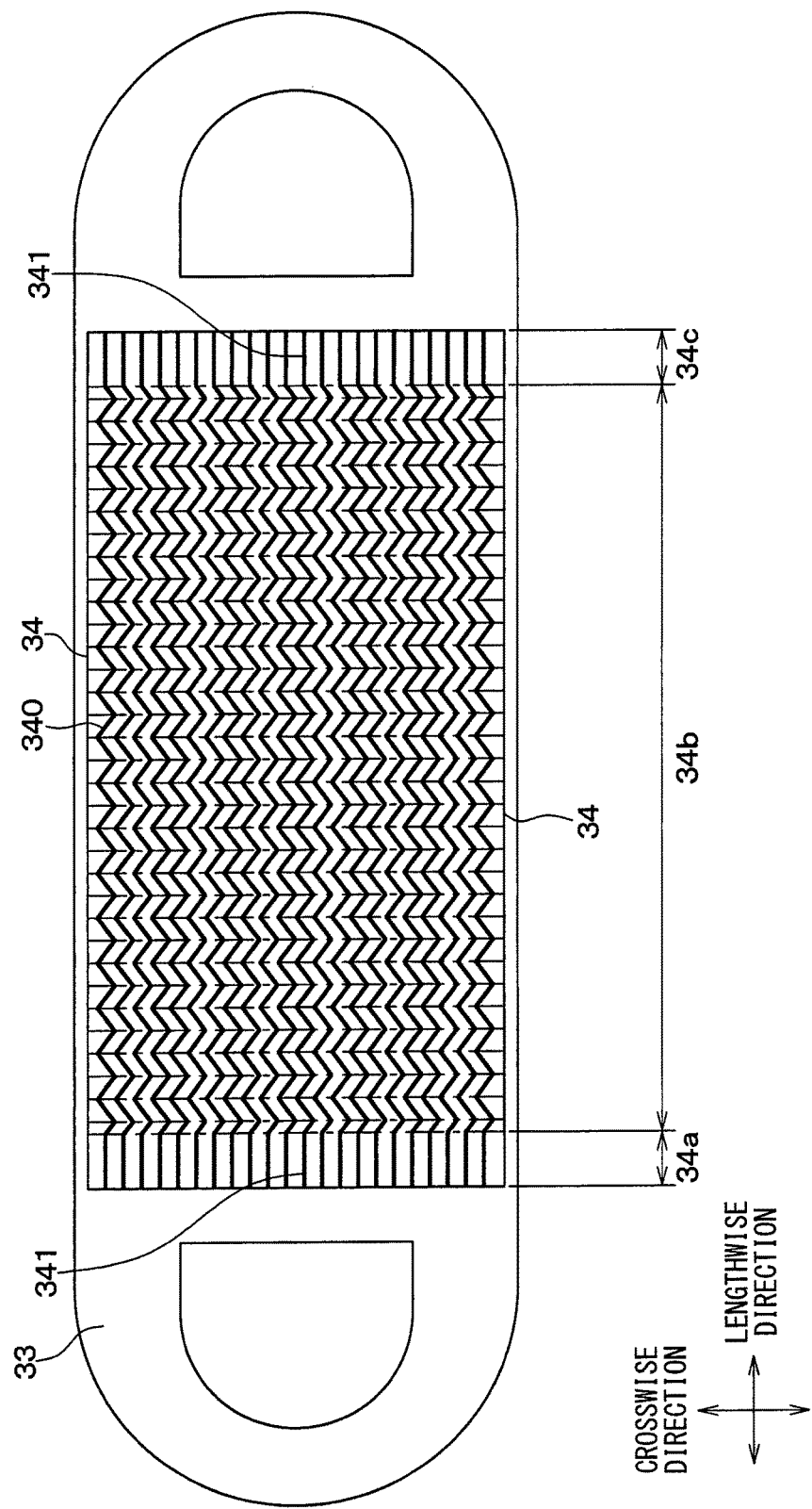
FIG. 5 is a diagram illustrating an inner fin provided on one side of an inner plate.

Configurations of the inner fin 34 will be described referring to FIGS. 5 to 9. The inner fin 34 includes multiple first fins 340 and multiple second fins 341. As shown in FIG. 5, a part of the inner fin 34 in which multiple first fins 340 are formed is a region 34b, an end portion located upstream of the region 34b with respect to a flow of the heat medium is an end portion 34a, and an end portion located downstream of the region 34b is an end portion 34c.

Figure 6:
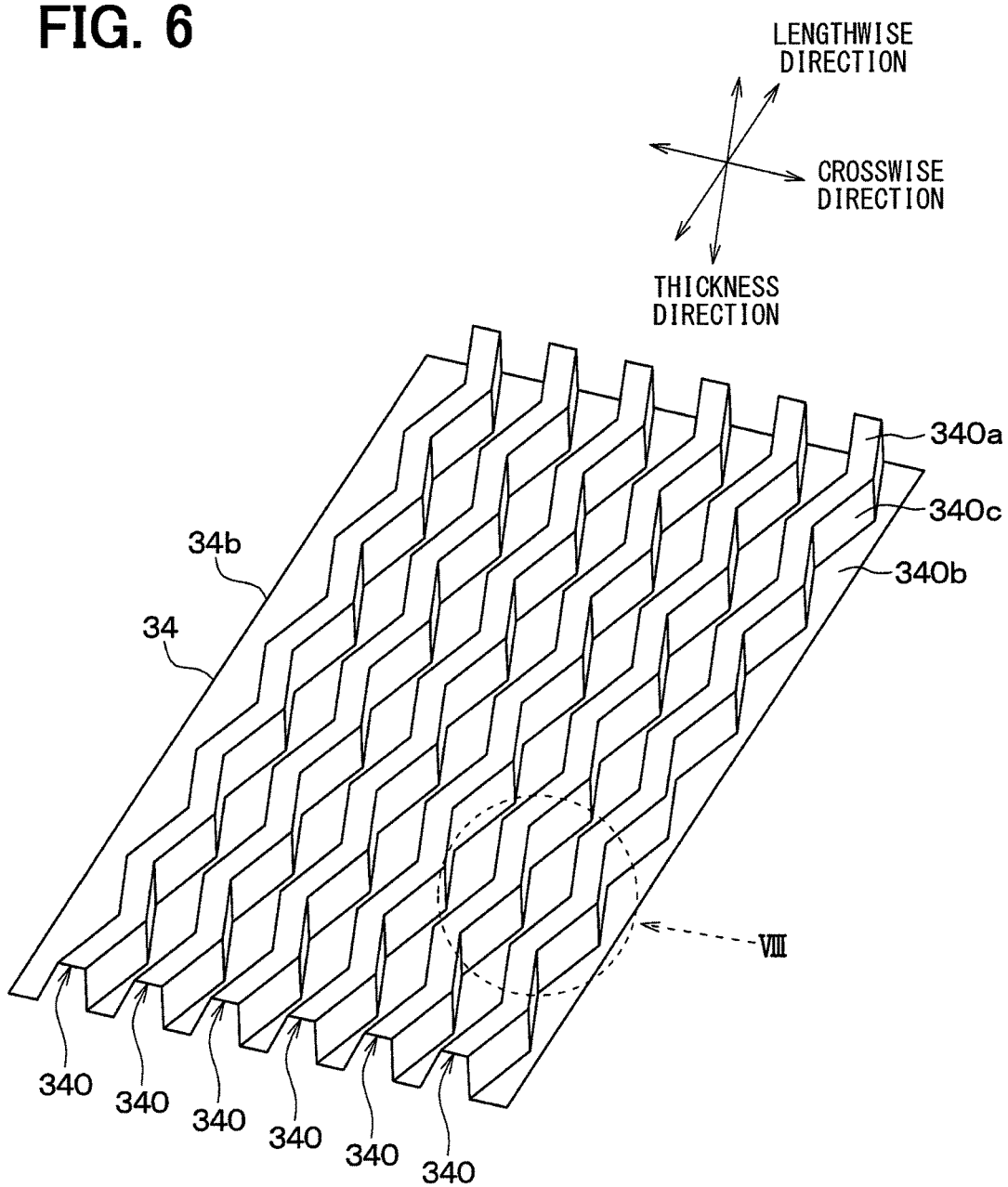
FIG. 6 is a perspective diagram illustrating a part of the inner fin in which a first fin is provided.

The first fin 340 partitions the heat medium passage 30 into multiple narrow passages. The heat medium passage 30 is a main passage through which the heat medium flows. As shown in FIGS. 3 and 6, in the region 34b in which multiple first fins 340 are provided, a shape of a cross-section of the region 34b of the inner fin 34 taken along a direction perpendicular to the lengthwise direction of the flow passage pipe 3 is a wavy shape, and a part around a crest of the wavy shape is in contact with the outer plates 31, 32, and the inner plate 33. The lengthwise direction may be the same direction as a flow direction of the heat medium.

A part of one first fin 340 that is convex to one side in the thickness direction of the flow passage pipe 3 and in contact with the outer plate 31 or the outer plate 32 is a crest portion 340a. A part of one first fin 340 that is convex to the other side in the thickness direction of the flow passage pipe 3 and in contact with the inner plate 33 is a bottom portion 340b. A part of one first fin 340 that connects the crest portion 340a and the bottom portion 340b with each other is a wall surface portion 340c.

In the region 34b of the inner fin 34 in which the first fin 340 is provided, the crest portion 340a and the bottom portion 340b are arranged in alternating manner and interconnected by the wall surface portion 340c, and accordingly a cross-sectional shape of the region 34b taken along a direction perpendicular to the lengthwise direction of the flow passage pipe 3 is a wavy shape. Specifically, in the first fin 340, the bottom portion 340b, the wall surface portion 340c, the crest portion 340a, the wall surface portion 340c, and the bottom portion 340b are arranged in this order. Since multiple first fins 340 having such configuration are arranged by connecting the bottom portions 340b to each other, the cross-sectional shape of the region 34b of the inner fin 34, in which multiple first fins 340 are provided, taken along the direction perpendicular to the lengthwise direction of the flow passage pipe 3 is a wavy shape.

Figure 7:
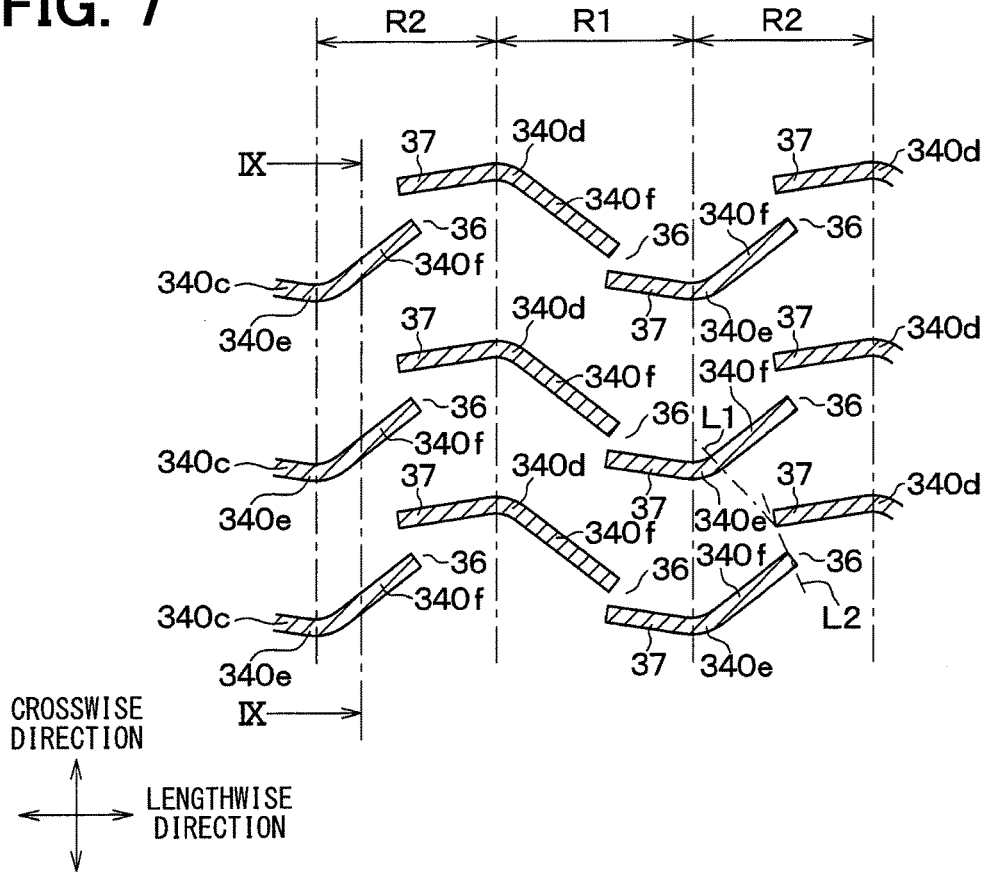
FIG. 7 is a cross-sectional diagram taken along VII-VII line of FIG. 3.

As shown in FIG. 7, the wall surface portion 340c includes multiple convex portions 340d, concave portions 340e, and intermediate portions 340f. In the wall surface portion 340c, the convex portions 340d and the concave portions 340e are arranged in alternating manner and interconnected by the intermediate portions 340f, and a cross-sectional shape of the wall surface portion 340c taken along a direction perpendicular to the thickness direction of the flow passage pipe 3 is a wavy shape.

A cross-section of the convex portion 340d taken along a direction perpendicular to the thickness direction of flow passage pipe 3 has a curved line shape convex toward a first side (one side) of the crosswise direction of the flow passage pipe 3. A cross-section of the concave portion 340e taken along a direction perpendicular to the thickness direction of the flow passage pipe 3 has a curved line shape convex toward a second side (the other side) of the crosswise direction of the flow passage pipe 3. The convex portion 340d and the concave portion 340e correspond to a first convex portion and a second convex portion respectively. A cross-section of the intermediate portion 340f taken along a direction perpendicular to the thickness direction of the flow passage pipe 3 has a straight line shape.

Since the wall surface portion 340c is constituted by the convex portion 340d, the concave portion 340e, and the intermediate portion 340f, the wall surface portion 340c has a shape bent into a triangular wave shape in the lengthwise direction of flow passage pipe 3 when the flow passage pipe 3 is viewed in the thickness direction of the flow passage pipe 3. The wall surface portion 340c corresponds to a wavy fin.

The second fin 341 defines the narrow passage together with the first fin 340, and the second fin 341 is provided in an end portion 34a and an end portion 34c so as to be in parallel with the lengthwise direction of the flow passage pipe 3. The second fin 341 has a straight line shape when viewed in the thickness direction of the flow passage pipe 3. Cross-sections of the end portion 34a and the end portion 34c, in which the second fin 341 of the inner fin 34 is provided, taken along a direction perpendicular to the lengthwise direction of the flow passage pipe 3 have a wavy shape.

In the inner fin 34, the second fin 341 provided in the end portion 34a, the first fin 340, and the second fin 341 provided in the end portion 34c constitute one continuous fin.

As shown in FIG. 7, multiple opening portions 36 are provided in the wall surface portion 340c. Two narrow passages that are next to each other across the wall surface portion 340c communicate with each other through the opening portions 36. In the present embodiment, the opening portion 36 is defined by a part extending from the concave portion 340d to the intermediate portion 340f and a part extending from the concave portion 340e to the intermediate portion 340f.

The inner fin 34 further includes the guide wall 37, and the wall surface portion 340c is connected to the guide wall 37. The guide wall 37 improves a heat transfer by a front edge effect, and the guide wall 37 guides the heat medium to an adjacent narrow passage so as to limit a generation of a flow separation.

The guide wall 37 is connected to an edge of the wall surface portion 340c defining a downstream end of the opening portion 36 in flow of the heat medium in one of the two adjacent passages that communicate with each other through the opening portion 36. The guide wall 37 protrudes from the wall surface portion 340c into the one narrow passage, and an end of the guide wall 37 faces upstream in flow of the heat medium. The inner fin 34 includes multiple guide walls 37, and the guide wall 37 is located so as to correspond to each of multiple opening portions 36.

Figure 8:
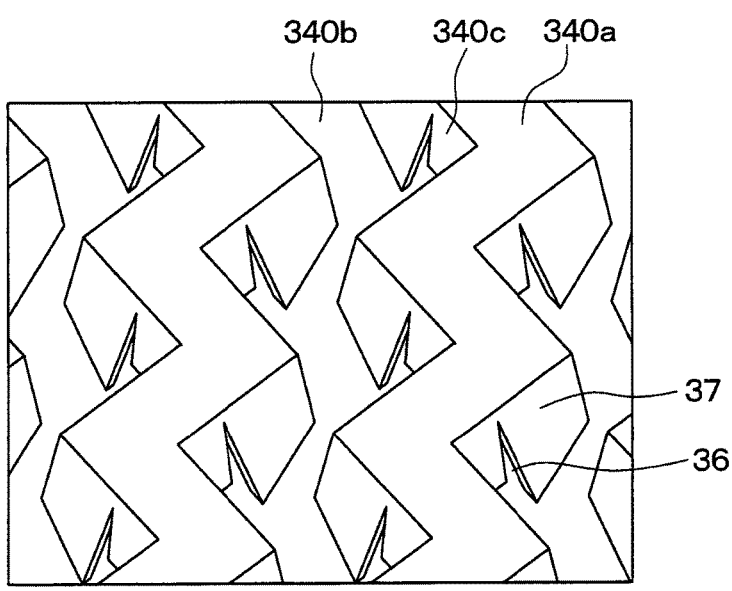
FIG. 8 is a diagram in which a part of FIG. 6 is enlarged.

In the present embodiment, the convex portion 340d and the guide wall 37, and the concave portion 340e and the guide wall 37 are seamlessly connected respectively, as shown in FIG. 7. As shown in FIG. 8, end portions of the guide wall 37 other than the end portion facing to the flow of the heat medium are connected to the crest portion 340a, the bottom portion 340b, or the wall surface portion 340c.

The opening portion 36 and the guide wall 37 can be formed by a pressing process in which cutting of the plate and bending of the cut portion are performed simultaneously. A part close to the cut portion which is located upstream of the cut portion in the heat medium passage 30 is a part of the first fin 340, and another part close to the cut portion which is located downstream of the cut portion is raised (separated) from the first fin 340 to be the guide wall 37. A part surrounded by a boundary between the guide wall 37 and the first fin 340, and a part of a lateral surface of the cut portion remained in the first fin 340 are the opening portion 36. Slits may be provided in the plate that is a material of the inner fin 34, and the opening portion 36 and the guide wall 37 may be formed by pressing the plate having the slits.

As described above, in the present embodiment, the heat medium flows in a direction facing to the end of the guide wall 37. As shown in FIG. 7, in a region R1 in which the heat medium flows from the convex portion 340d toward the concave portion 340e when the heat medium flows in the direction facing to the end of the guide wall 37, the guide wall 37 protrudes from the wall surface portion 340c into the narrow passage to which the concave portion 340e is convex. In the region R1 in which the heat medium flows from the convex portion 340d toward the concave portion 340e when the heat medium flows in the direction facing to the end of the guide wall 37, the guide wall 37 may protrude from the wall surface portion 340c to the second side of the crosswise direction of the flow passage pipe 3. In a region R2 in which the heat medium flows from the concave portion 340e toward the convex portion 340d, the guide wall 37 protrudes from the wall surface portion 340c into the narrow passage to which the convex portion 340d is convex. In the region R2 in which the heat medium flows from the concave portion 340e toward the convex portion 340d, the guide wall 37 may protrude from the wall surface portion 340c to the second side of the crosswise direction of the flow passage pipe 3. The heat medium flows from left side to right side in the sheet of FIG. 7.

A main flow is a flow of the heat medium that remains in one narrow passage without being guided to the adjacent narrow passage by the guide wall 37, and a branched flow is a flow guided to the adjacent narrow passage by the guide wall 37. A cross-sectional area of the main flow is larger than that of the branched flow.

A straight line L1 of FIG. 7 indicates a plane, which includes the end of the guide wall 37 facing to the flow of the heat medium and is perpendicular to a direction of the main flow of the heat medium. A straight line L2 indicates a plane, which includes the end of the guide wall 37 facing to the flow of the heat medium and is perpendicular to a direction of the branched flow of the heat medium. The cross-sectional area of the main flow is an area of a part which is defined, in the plane indicated by the straight line L1, by the crest portion 340a or the bottom portion 340b, the wall surface portion 340c, the guide wall 37, and the outer plates 31, 32 or the inner plate 33. The cross-sectional area of the branched flow is an area of a part defined, in the plane indicated by the straight line L2, by the wall surface portion 340c, the guide wall 37, and the crest portion 340a or the bottom portion 340b.

Figure 9:
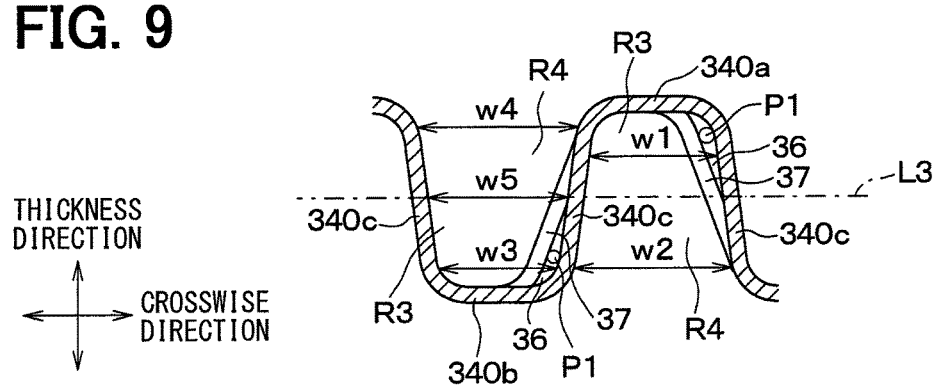
FIG. 9 is a cross-sectional diagram taken along IX-IX line of FIG. 7.

In the present embodiment, as shown in FIG. 9, the guide wall 37 protrudes into a region R3 of one of two narrow passages next to each other across the wall surface portion 340c so as to guide the heat medium to a region R4 of the other one of two narrow passages.

A width of the narrow passage in the crosswise direction of the flow passage pipe 3 varies in the thickness direction of the flow passage pipe 3, and the width of the narrow passage in the region R3 is narrower than a predetermined width. The width of the narrow passage in the region R4 is wider than the predetermined width.

The inner fin 34 is formed by pressing the metal plate having a plate shape. Accordingly, in a region defined by the crest portion 340a, the wall surface portion 340c, and the inner plate 33, a width w1 around the crest portion 340a in the crosswise direction of the flow passage pipe 3 is smaller than a width w2 around the inner plate 33. In a region defined by the bottom portion 340b, the wall surface portion 340c, and the outer plate 31 or the outer plate 32, a width w3 around the bottom portion 340b in the crosswise direction of the flow passage pipe 3 is smaller than a width w4 around the outer plate 31 or the outer plate 32.

In the present embodiment, the regions R3, R4 are located in each of the narrow passages on both sides of a plane perpendicular to the thickness direction of the flow passage pipe 3. A distance from the crest portion 340a to the plane in the thickness direction of the flow passage pipe 3 is equal to a distance from the bottom portion 340b to the plane. A width of a part, at which the a distance from the crest portion 340a in the thickness direction of the flow passage pipe 3 and a distance from the bottom portion 340b are the same, is a width w5 (corresponding to the predetermined width described above). The width of the region R3 is smaller than the width w5, and the width of the region R4 is larger than the width w5.

The region R3 is located in the narrow passage between the plane and the crest portion 340a or the bottom portion 340b. The region R4 is located in the narrow passage and defined by the plane, and the outer plates 31, 32 or the inner plate 33. The straight line L3 in FIG. 9 indicates a boundary between the region R3 and the region R4. The regions R3, R4 correspond to a first region and a second region, respectively.

In the above-described configurations, the heat medium flows into the flow passage pipe 3 from the heat medium introduction portion 4 directly or through the supply header portion 11, and the heat medium is discharged from the heat medium discharge portion 5 directly or through the discharge header portion 12. The electronic component 2 is cooled by the heat exchange between the electronic component 2 and the heat medium.

Figure 10:
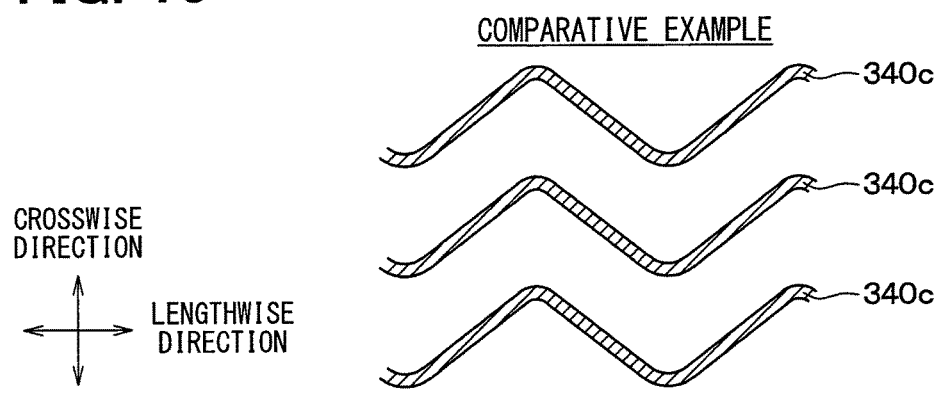
FIG. 10 is a cross-sectional view illustrating a narrow passage of a heat exchanger that does not include an opening portion, and corresponds to FIG. 7.
Figure 11:
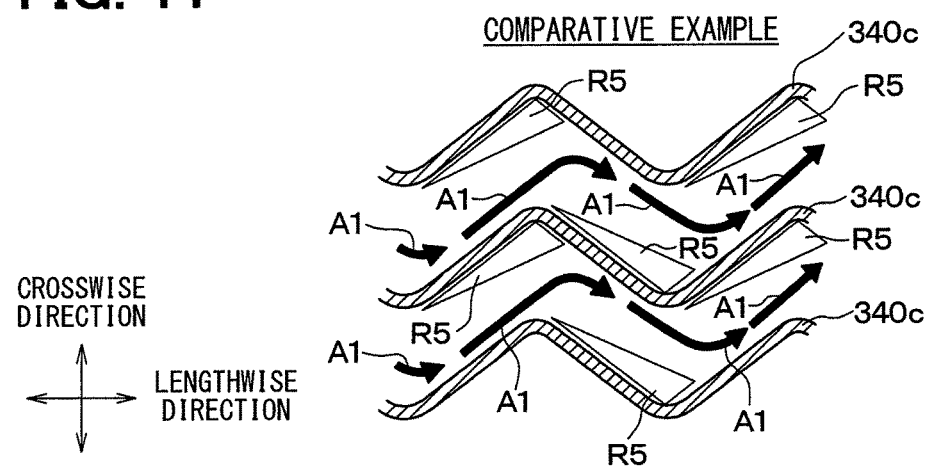
FIG. 11 is a cross-sectional diagram illustrating a separation of a flow in the heat exchanger that does not include an opening portion, and corresponds to FIG. 12.
Figure 12:
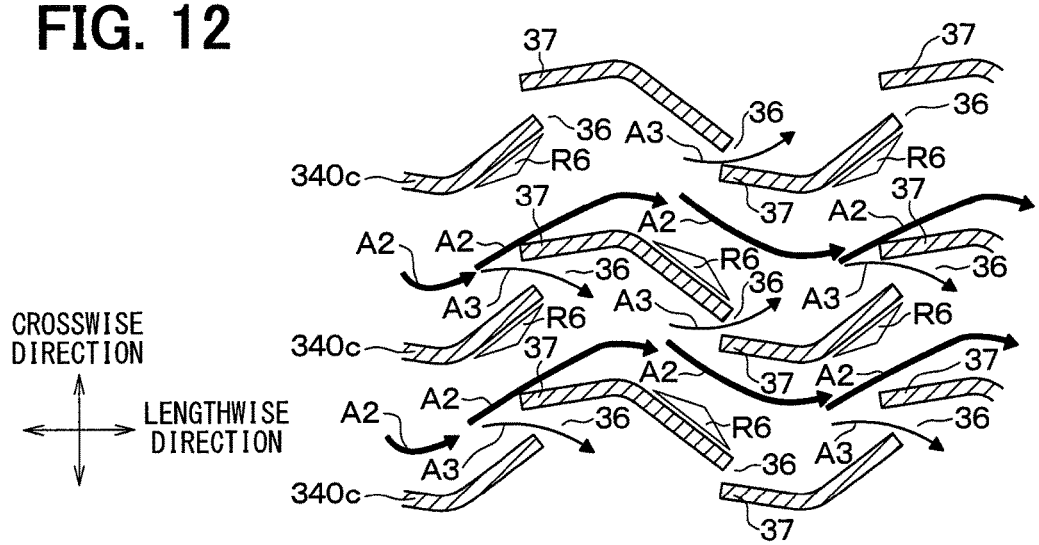
FIG. 12 is a cross-sectional diagram taken along VII-VII line of FIG. 3.

In the flow passage pipe 3, the heat medium flows tortuously in multiple narrow passages having a wavy shape. FIGS. 10, 11 are cross-sectional diagrams illustrating a heat exchanger that does not include the opening portion 36.

In the present embodiment, the end of the guide wall 37 faces to the upstream side of the flow of the heat medium. According to this, the heat medium hits against the end of the guide wall 37, and the heat transfer is enhanced by the front edge effect. Accordingly, a thermal performance of the heat exchanger is improved.

Moreover, in the heat exchanger that does not include the opening portion 36 as shown in FIG. 10, a separation of the heat medium may occur when the heat medium flows tortuously as indicated by an arrow A1 in FIG. 11. As indicated by a region R5 in FIG. 11, the separation may occur around the wall surface portion 340c that is an inner side of a curve when the heat medium passes along the curve defined by two convex portions 340d or two concave portions 340e. The flow in the separation area is slow, and a contribution of the separation area for enhancing the heat transfer is smaller than that of an area in which the flow is fast. The separation may cause an increase of a pressure loss in the flow passage pipe 3. Accordingly, the generation of the separation may cause the deterioration of the thermal performance of the heat exchanger.

In contrast, in the present embodiment, the opening portion 36 is provided, and the guide wall 37 is connected to an edge of the wall surface portion 340c defining the downstream side of the opening portion 36. Moreover, the guide wall 37 protrudes from the wall surface portion 340c into one of two narrow passages which are adjacent to each other across the wall surface portion 340c. Accordingly, a part of the tortuous flow indicated by arrows A2 in FIG. 12 flows into a vicinity of the wall surface portion 340c through the opening portion 36, the vicinity of the wall surface portion 340c being a region in which the separation may occur if the opening portion 36 is not provided, and the separation in the vicinity is suppressed. A region R6 in FIG. 12 indicates a region in which the separation may occur in the present embodiment, and the region R6 is smaller than the region R5 in which the separation may occur when the opening portion 36 is not provided.

As described above, in the present embodiment, the separation is suppressed, and an area that contributes the enhancement of the heat transfer increases in a part in which the inner fin 34 contacts the heat medium. Accordingly, the increase of the pressure loss can be limited, and the thermal performance of the heat exchanger is improved. Since the cross-sectional area of the main flow is larger than that of the branched flow, a flow rate of the main flow that remains in the same narrow passage without passing through the opening portion 36 is larger than a flow rate of the branched flow that flowing into the adjacent narrow passage through the opening portion 36, and accordingly the tortuous flow of the main flow is remained.

In the stacking-type heat exchanger 1 including the heat exchanger of the present embodiment, since the opening portion 36 and the guide wall 37 are provided, the inner fin 34 has a shape capable of enhancing the heat exchange more, and accordingly the thermal performance (the amount of heat exchange) of the heat exchanger can be improved.

Figure 13:
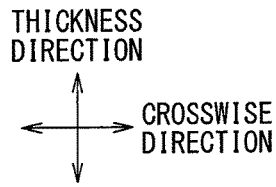
FIG. 13 is a cross-sectional diagram illustrating a wavy fin of the heat exchanger that does not include the opening portion, and corresponds to FIG. 14.
Figure 13:
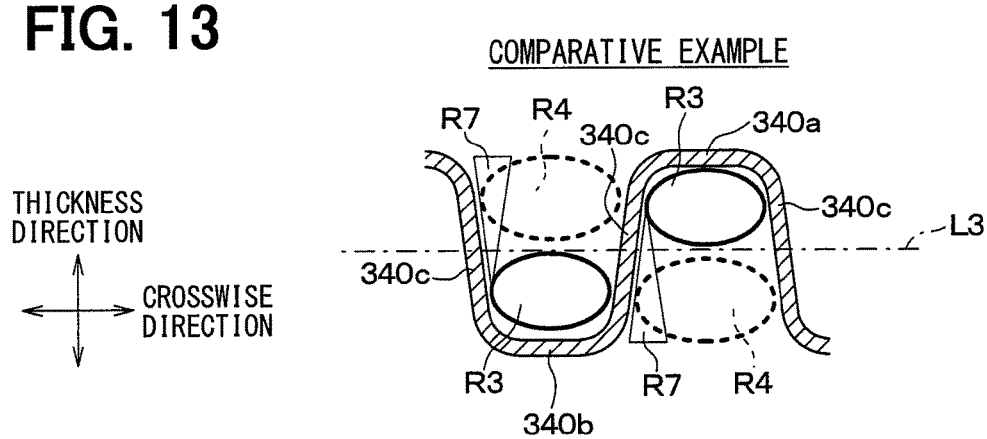

In the wavy fin that does not include the opening portion 36, the flow is slow in the region in which the width in the crosswise direction is large compared to a region in which the width in the crosswise direction is small, and accordingly the separation area is large as indicated by a region R7 in FIG. 13. When the stacking-type heat exchanger 1 is used for cooling, due to effects of the flow velocity, a temperature of the heat medium in the region in which the width in the crosswise direction is large is higher than that in the region in which the width in the crosswise direction is small.

In consideration of such characteristics of the wavy fin, when the heat medium flowing through the narrow region in which the width in the crosswise direction is small is sent to the wide region of the adjacent narrow passage in which the width in the crosswise direction is large, a velocity distribution and a temperature distribution can be effectively improved, accordingly the thermal performance of the heat exchanger can be improved.

Figure 14:
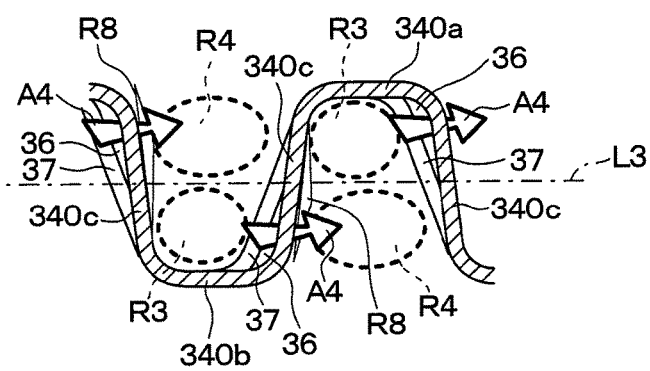
FIG. 14 is a cross-sectional diagram taken along IX-IX line of FIG. 7.

Regarding this point, in the present embodiment, the guide wall 37 protrudes into the region R3 of one of two adjacent narrow passages so as to guide the heat medium to the region R4 of the other one of the two adjacent narrow passages as indicated by arrows A4 in FIG. 14. Therefore, the velocity distribution and the temperature distribution are improved, and the separation is limited. A region R8 in FIG. 14 indicates a part in which the separation may occur in the present embodiment and is smaller than the region R7 in which the separation may occur if the opening portion 36 is not provided. Accordingly, the thermal performance of the heat exchanger can be further improved.

The increase of the pressure loss in the flow passage pipe 3 is limited by suppressing the generation of the separation, but a pressure loss due to the protrusion of the guide wall 37 into the narrow passage may increase. Regarding this point, in the present embodiment, the generation of the separation is effectively limited by providing the guide wall 37 as described above, and accordingly the increase of the pressure loss is significantly limited. Accordingly, the increase of the pressure loss as a whole of the heat exchanger can be limited with limiting the generation of the separation, and the thermal performance of the heat exchanger can be further improved.

In the present embodiment, the guide wall 37 protrudes into the region R3, in which the width in the crosswise direction is small and the flow velocity of the heat medium is large. Accordingly, since the heat medium hits against the edge of the guide wall 37 at high velocity, the enhancing effect due to the front edge effect becomes large, and accordingly the thermal performance of the heat exchanger can be further improved.

The guide wall 37 may be provided in a part in which the flow velocity of the heat medium is at maximum in each of the narrow passages. According to this, since the heat medium hits against the edge of the guide wall 37 at high velocity, the enhancing effect due to the front edge effect becomes large, and accordingly the thermal performance of the heat exchanger can further improved.

In a part located on an inner side of the convex portion 340d or the concave portion 340e and in the region R4, the separation may be likely to occur. Accordingly the opening portion 36 and the guide wall 37 may be provided, such that the branched flow flows into this part.

Second Embodiment

A second embodiment of the present disclosure will be described below. In the present embodiment, positions of the opening portion 36 and the guide wall 37 are different from the first embodiment. Since the other configurations are the same as the first embodiment, only the point different from the first embodiment will be described.

Figure 15:
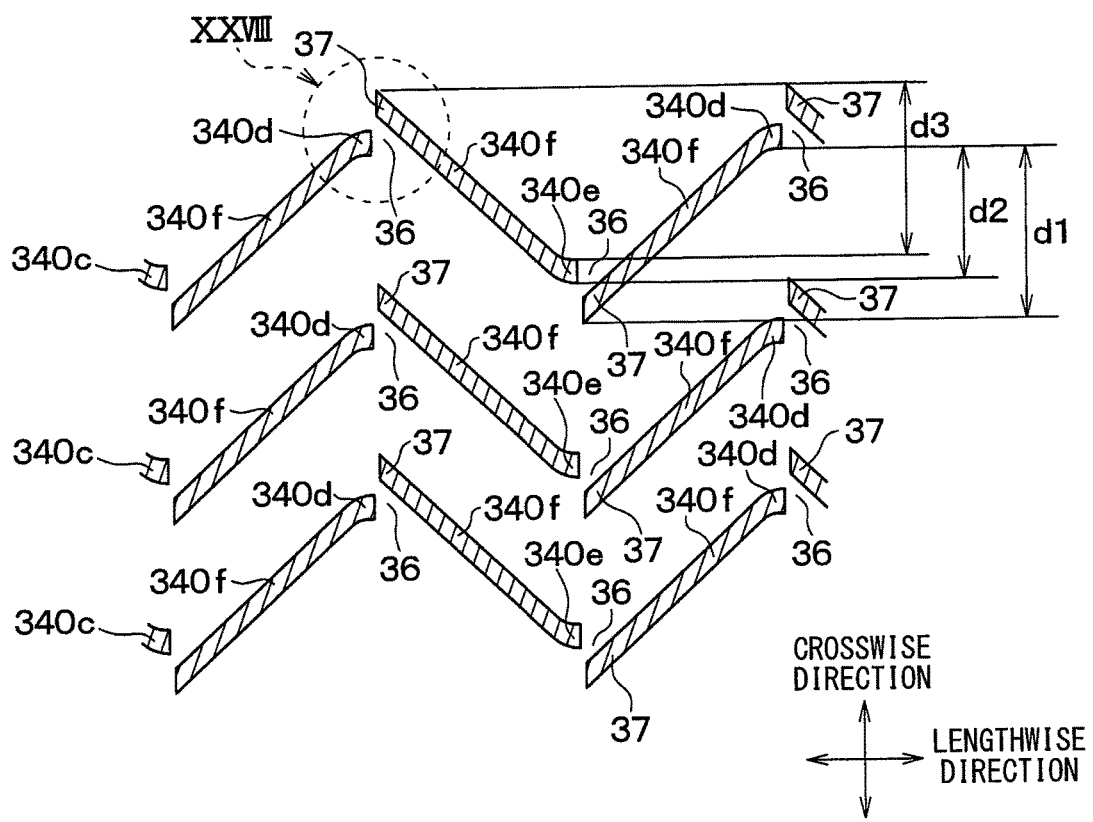
FIG. 15 is a cross-sectional diagram illustrating a narrow passage according to a second embodiment, and corresponds to FIG. 7.
Figure 16:
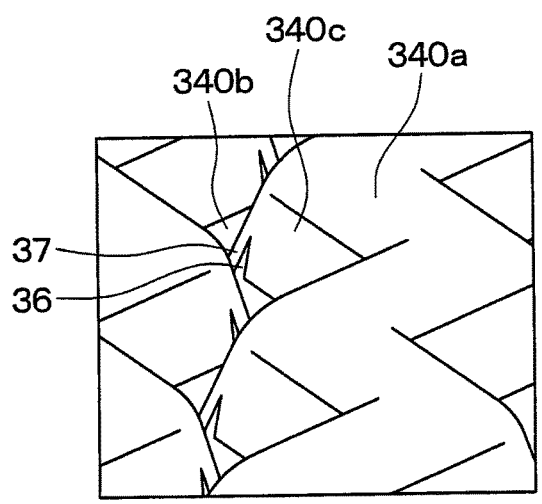
FIG. 16 is a perspective view illustrating a part of an inner fin in which a first fin is provided, according to the second embodiment, and FIG. 16 corresponds to FIG. 8.

In the present embodiment, the opening portion 36 is provided in the convex portion 340d and the concave portion 340e as shown in FIGS. 15, 16. A guide wall 37 corresponding to the opening portion 36 provided in the convex portion 340d is connected to the convex portion 340d and protrudes from the wall surface portion 340c to a side to which the convex portion 340d is convex. The guide wall 37 corresponding to the opening portion 36 provided in the convex portion 340d may protrude from the wall surface portion 340c to the first side of the crosswise direction. The guide wall 37 corresponding to the opening portion 36 provided in the concave portion 340e is connected to the concave portion 340e and protrudes from the wall surface portion 340c to a side to which the concave portion 340e is convex. The guide wall 37 corresponding to the opening portion 36 provided in the concave portion 340e may protrude from the wall surface portion 340c to the second side of the crosswise direction.

In at least some cross-sections perpendicular to the thickness direction of the flow passage pipe 3, the guide wall 37 is provided, such that a distance d1 is larger than a distance d2.

The wall surface portion 340c includes a part (a first continuous portion) constituted by one convex portion 340d, one intermediate portion 340f directly connected to the one convex portion 340d, one concave portion 340e directly connected to the one intermediate portion 340f, and one guide wall 37 directly connected to the one concave portion 340e. In a surface of the first continuous portion facing to the first side of the crosswise direction of the flow passage pipe 3, the distance d1 is a distance in the crosswise direction of the flow passage pipe 3 between an outermost part on the first side and an outermost part on the second side.

In the present embodiment, in a surface of the first continuous portion facing to the second side of the crosswise direction of the flow passage pipe 3, a distance in the crosswise direction of the flow passage pipe 3 between an outermost part on the first side and an outermost part on the second side is also the distance d1.

The wall surface portion 340c includes a part (second continuous portion) constituted by one convex portion 340d, one intermediate portion 340f directly connected to the one convex portion 340d, and one concave portion 340e directly connected to the one intermediate portion 340f. In a surface of the second continuous portion facing to the first side of the crosswise direction of the flow passage pipe 3, the distance d2 is a distance in the crosswise direction of the flow passage pipe 3 between an outermost part on the first side and an outermost part on the second side.

In the present embodiment, in a surface of the second continuous portion facing to the second side of the crosswise direction of the flow passage pipe 3, a distance in the crosswise direction of the flow passage pipe 3 between an outermost part on the first side and an outermost part is also the distance d2.

In the present embodiment, the wall surface portion 340c includes a part (third continuous portion) constituted by one convex portion 340d, one intermediate portion 340f directly connected to the one convex portion 340d, one concave portion 340e directly connected to the one intermediate portion 340f, and one guide wall 37 directly connected to the convex portion 340d. In a surface of the third continuous portion facing to the first side of the crosswise direction of the flow passage pipe 3, a distance d3 is a distance in the crosswise direction of the flow passage pipe 3 between an outermost part on the first side and an outermost part on the second side. The distance d3 is equal to the distance d1, and the distance d3 is larger than the distance d2. These relationships are the same on a surface disposed on the second side of the crosswise direction of the flow passage pipe 3.

Figure 17:
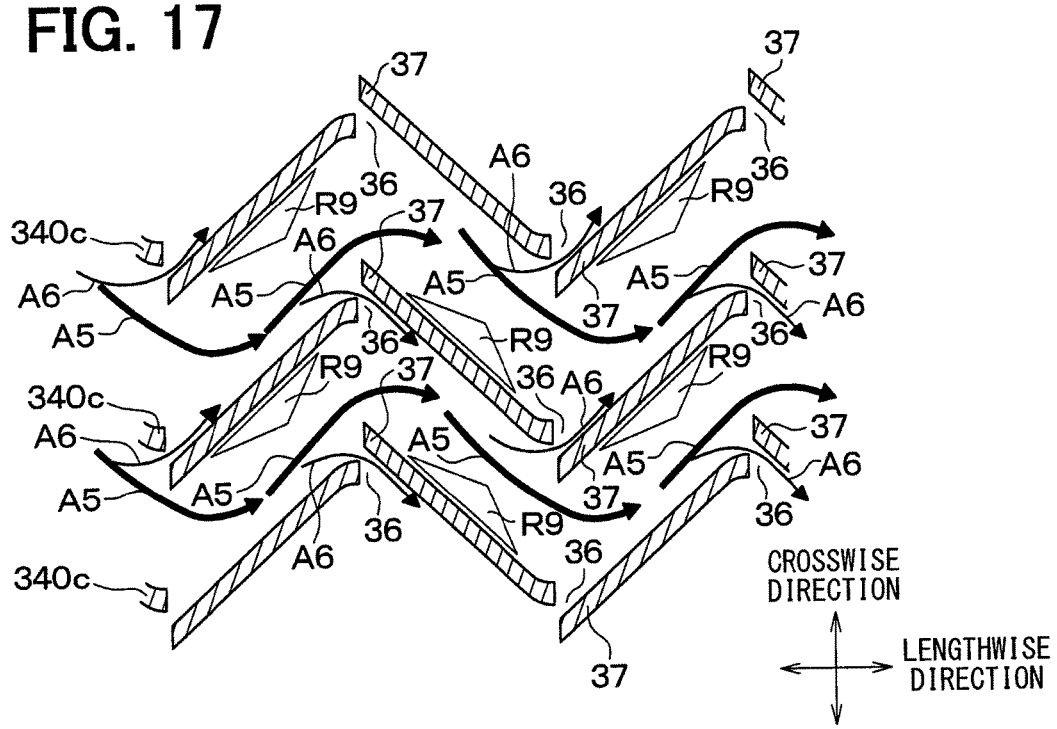
FIG. 17 is a cross-sectional diagram illustrating the narrow passage according to the second embodiment, and corresponds to FIG. 12.

In the present embodiment, since the opening portion 36 is provided, a part of a tortuous flow indicated by arrows A5 in FIG. 17 flows, as indicated by arrows A6, into a region in which the separation may occur if the opening portion 36 is not provided, and accordingly the separation is limited in this region. A region R9 shown in FIG. 17 is a region in which the separation may occur in the present embodiment and is smaller than the region R5 in which the separation may occur if the opening portion 36 is not provided. Accordingly, the thermal performance of the heat exchanger can be improved, similarly to the first embodiment.

Moreover, according to the present embodiment, effects of the wavy fin, which improves the thermal performance of the heat exchanger by increasing the length of the flow passage of the heat medium in the flow passage pipe 3 to regionally increase the flow rate, can be improved.

For example, in a heat exchanger disclosed in JP S54-115654 U, in order to improve a heat transfer effect, a lancing portion is provided in a fin to enhance a turbulence flow. In this heat exchanger, the lancing portion is provided such that a tortuous refrigerant flow flows through the lancing portion, and the shape of the lancing portion disturbs the tortuous flow that is a feature of the wavy fin. Accordingly, the heat transfer enhancing effect due to an increase of a regional flow rate may not be obtained.

In contrast, in the present embodiment, the guide wall 37 corresponding to the opening portion 36 provided in the convex portion 340d protrudes into the narrow passage to which the convex portion 340d is convex. The guide wall 37 corresponding to the opening portion 36 provided in the concave portion 340e protrudes into the narrow passage to which the concave portion 340e is convex. The guide wall 37 corresponding to the opening portion 36 provided in the convex portion 340d may protrude from the wall surface portion 340c to the first side of the crosswise direction, and the guide wall 37 corresponding to the opening portion 36 provided in the concave portion 340e may protrude from the wall surface portion 340c to the second side of the crosswise direction. In at least some cross-sections of a part constituted by the wall surface portion 340c and the guide wall 37 taken along a direction perpendicular to the thickness direction of the inner fin 34, the distances d1 and d3 are larger than the distance d2.

Accordingly, a depth of the tortuous flow of the heat medium is large compared to a case where the guide wall 37 is not provided. That is, when dimensions of the inner fin 34 and the flow rate of the heat medium passing along the inner fin 34 are constant, according to the present embodiment, the tortuous flow is deep, the flow passage is substantially long, the regional flow rate is increased, and accordingly the thermal performance of the heat exchanger can be further improved. The depth of the tortuous flow may be a travel distance of the tortuous flow of the heat medium in the crosswise direction. That is, when the tortuous flow is deep, the travel distance of the tortuous flow of the heat medium in the crosswise direction may be large. The depth of the tortuous flow of the heat medium may be an amplitude of the tortuous flow of the heat medium in the crosswise direction. That is, when the tortuous flow is deep, the amplitude of the tortuous flow in the crosswise direction may be large.

Third Embodiment

A third embodiment of the present disclosure will be described below. In the present embodiment, a direction of the flow of the heat medium is different from the first embodiment, and the other configurations are the same as the first embodiment. Only the points different from the first embodiment will be described.

Figure 18:
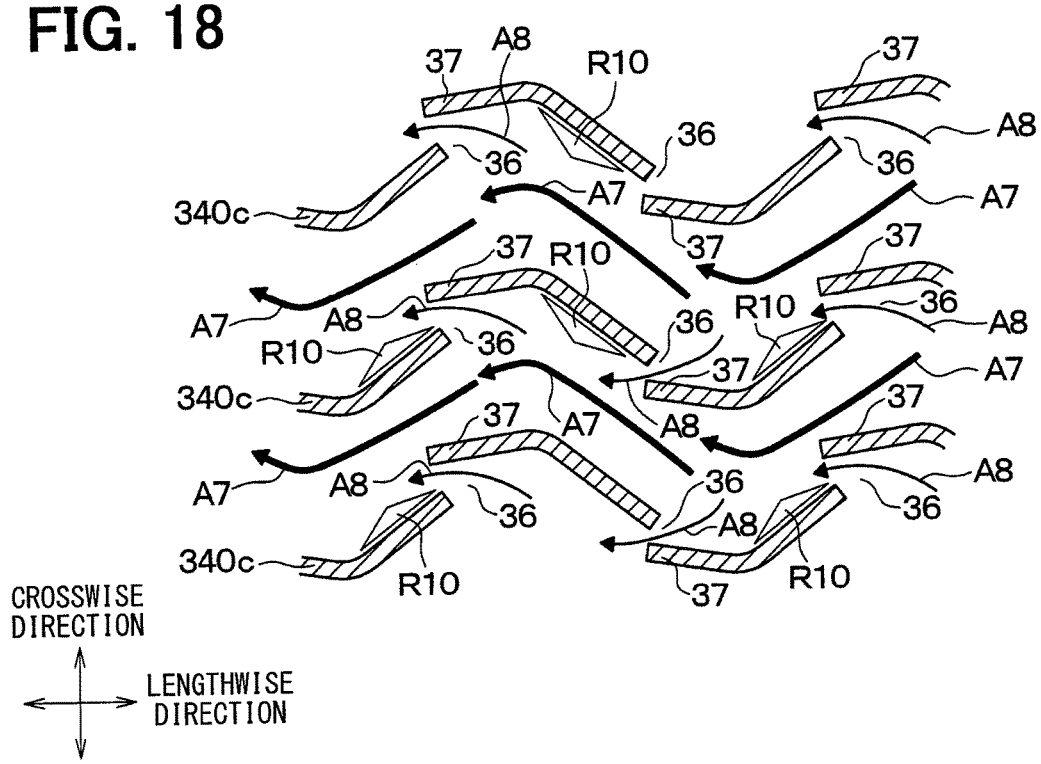
FIG. 18 is a cross-sectional diagram illustrating a narrow passage according to a third embodiment, and corresponds to FIG. 12.

As shown in FIG. 18, in the present embodiment, the heat medium flows in an opposite direction from the flow direction of the heat medium in the first embodiment. In the present embodiment, a guide wall 37 is connected to an edge of the wall surface portion 340c defining an upstream side of the opening portion 36 in flow of the heat medium in one of two adjacent narrow passages that communicate with each other through the opening portion 36. The guide wall 37 protrudes from the wall surface portion 340c into the one narrow passage, and an edge of the guide wall 37 faces downstream in flow of the heat medium.

Figure 19:
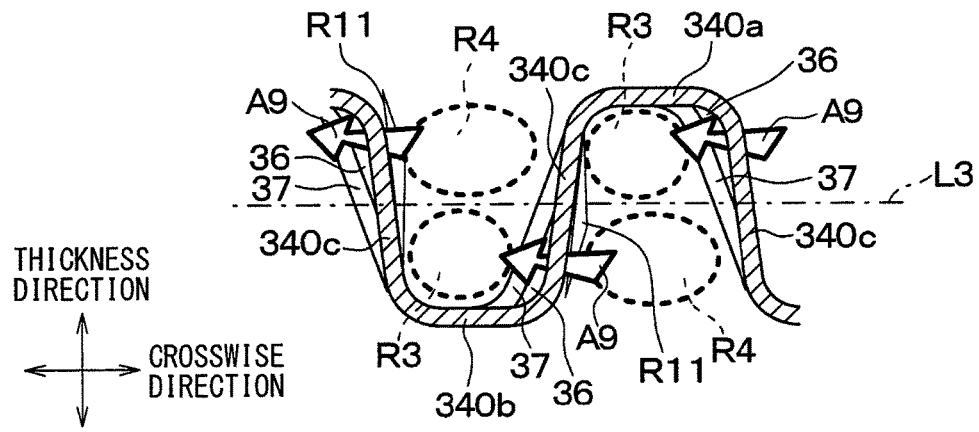
FIG. 19 is a cross-sectional diagram illustrating a wavy fin according to the third embodiment, and corresponds to FIG. 14.

In this configuration, the heat medium flows from a region R4 into a region R3 through the opening portion 36 as indicated by arrows A9 in FIG. 19, and accordingly the velocity distribution and the temperature distribution of the heat medium are improved similarly to the first embodiment. Accordingly, as shown in FIGS. 18, 19, regions R10, R11 in which the separation may occur in the present embodiment are smaller than regions R5, R7 in which the separation may occur if the opening portion 36 is not provided. According to the present embodiment, the separation is suppressed, and the thermal performance of the heat exchanger can be improved.

In the present embodiment, the main flow indicated by arrows A7 in FIG. 18 is pulled outward of a curve by the branched flow indicated by arrows A8, and accordingly the tortuous flow is deeper than the first embodiment. Accordingly, the flow rate increases regionally, and the thermal performance of the heat exchanger can be further improved. When the tortuous flow is deep, the amount of travel of the tortuous flow in the crosswise direction may be large.

Fourth Embodiment

A fourth embodiment of the present disclosure will be described below. In the present embodiment, the flow direction of the heat medium is different from the second embodiment. Since the other configurations are the same as the second embodiment, only the points different from the second embodiment will be described.

Figure 20:
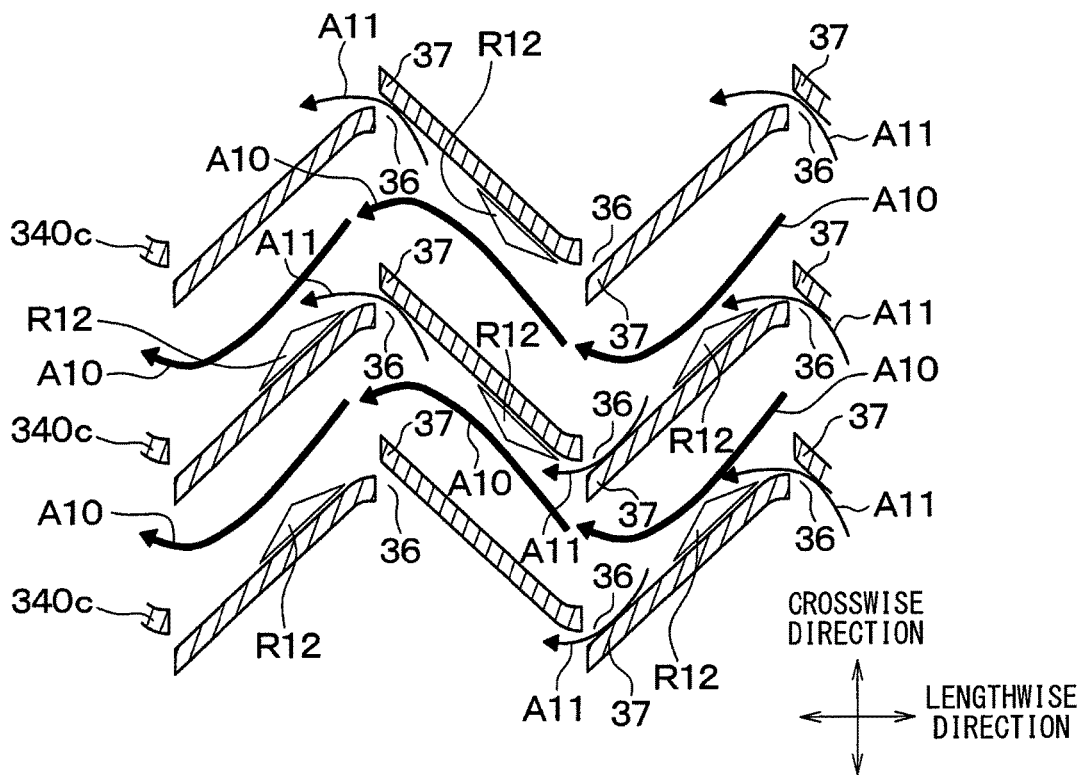
FIG. 20 is a cross-sectional diagram illustrating a narrow passage according to a fourth embodiment, and corresponds to FIG. 12.

As shown in FIG. 20, in the present embodiment, the heat medium flows in an opposite direction from the flow direction of the heat medium in the second embodiment, and an edge of a guide wall 37 faces downstream in flow of the heat medium.

According to such configurations of the present embodiment, since a main flow indicated by arrows A10 in FIG. 20 is pulled outward of a curve by a branched flow indicated by arrows A11, and a tortuous flow is deeper than the second embodiment. According to this, a region R12 in which a separation may occur in the present embodiment is smaller than the region R9 in which the separation may occur in the second embodiment. Moreover, since the tortuous flow is deep, a regional flow rate increases. Accordingly, a thermal performance of the heat exchanger can be further improved. When the tortuous flow is deep, the amount of travel of the tortuous flow in the crosswise direction may be large.

While the present disclosure has been described with reference to embodiments thereof, it is to be understood that the disclosure is not limited to the embodiments and constructions. The present disclosure is intended to cover various modification and equivalent arrangements. In addition, while various combinations and configurations are shown in the present disclosure, other combinations and configurations, including more, less or only a single element, are also within the spirit and scope of the present disclosure. The present disclosure is not limited to the above-described embodiments and can be modified.

Figure 21:
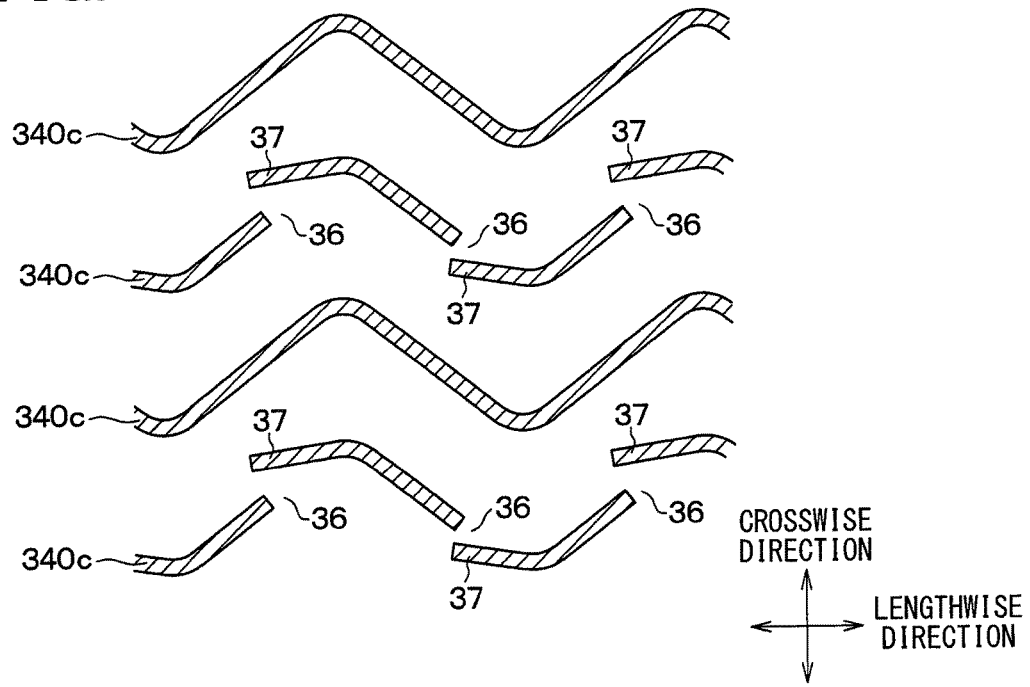
FIG. 21 is a cross-sectional view illustrating a position of a communication passage according to a modification of the embodiments of the present disclosure, and corresponds to FIG. 7.
Figure 22:
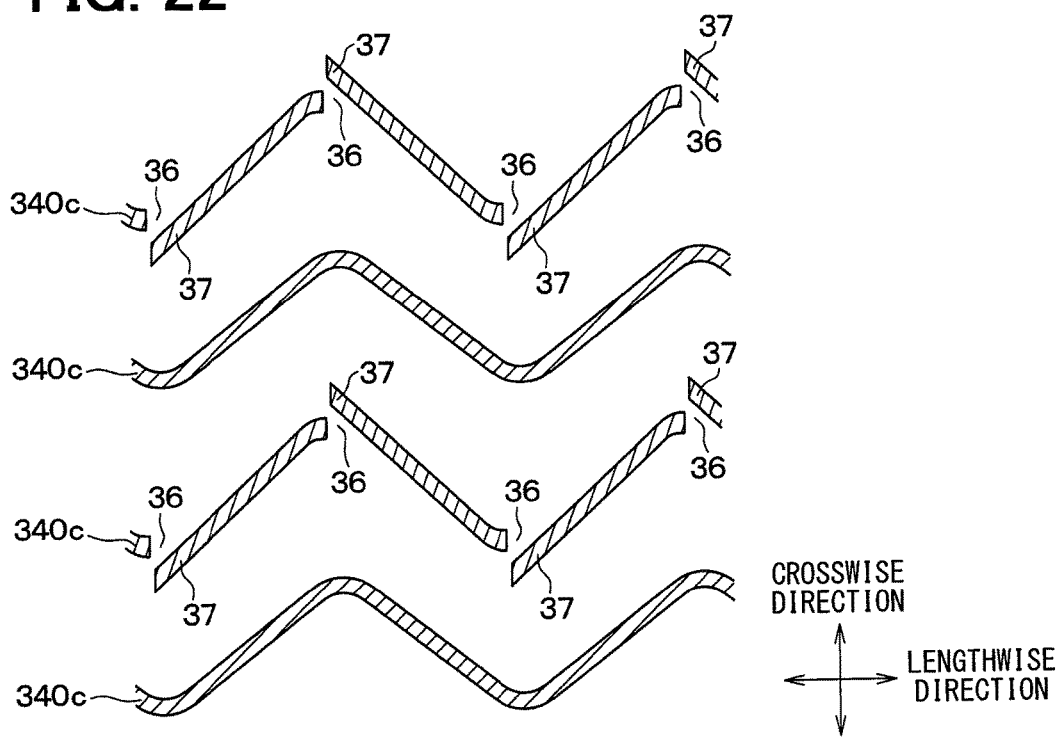
FIG. 22 is a cross-sectional view illustrating a position of a communication passage according to a modification of the embodiments of the present disclosure, and corresponds to FIG. 7.

In FIGS. 7, 15 of the first and second embodiments, all of the wall surface portions 340c have the opening portion 36, but the opening portion 36 may be provided in only some of the wall surface portion 340c. For example, as shown in FIGS. 21, 22, the wall surface portion 340c having the opening portion 36 and the wall surface portion 340c without the opening portion 36 may be arranged alternately.

Figure 23:
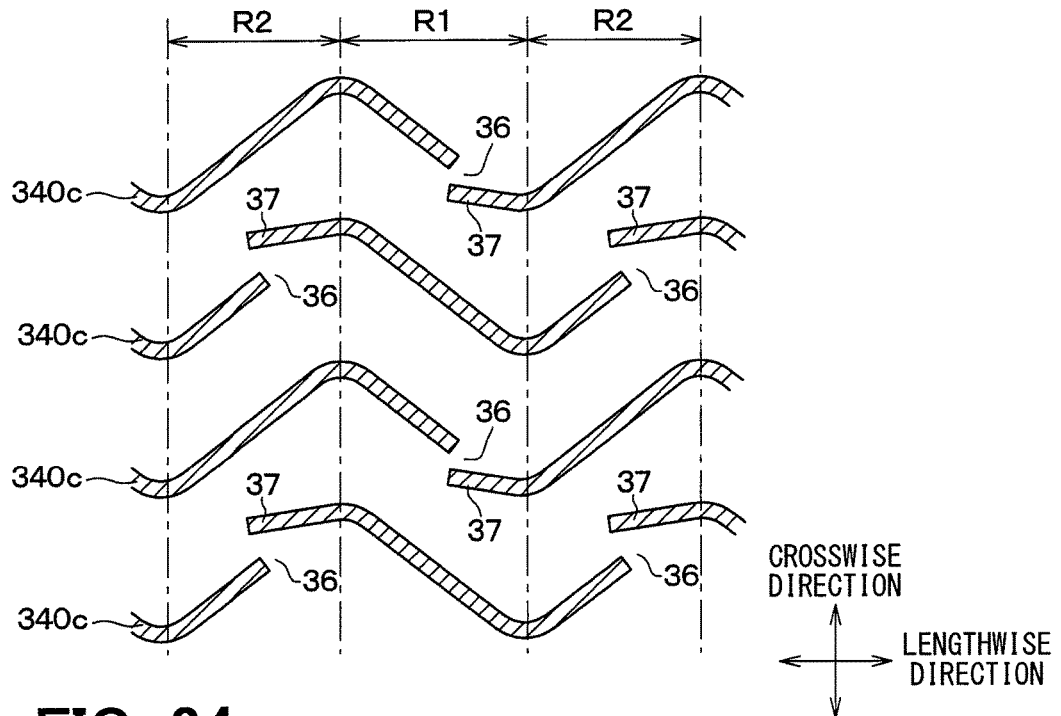
FIG. 23 is a cross-sectional view illustrating a position of a communication passage according to a modification of the embodiments of the present disclosure, and corresponds to FIG. 7.

In the first embodiment, the opening portion 36 is provided in both the region R1 and the region R2, but the opening portion 36 may be provided only in the region R1 or the region R2. The opening portion 36 may be provided in both the region R1 and the region R2, only in the region R1, or only in the region R2 based on the wall surface portions 340c. For example, as shown in FIG. 23, the wall surface portion 340c in which the opening portion 36 is provided only in the region R1 and the wall surface portion 340c in which the opening portion 36 is provided only in the region R2 may be arranged alternately.

Figure 24:
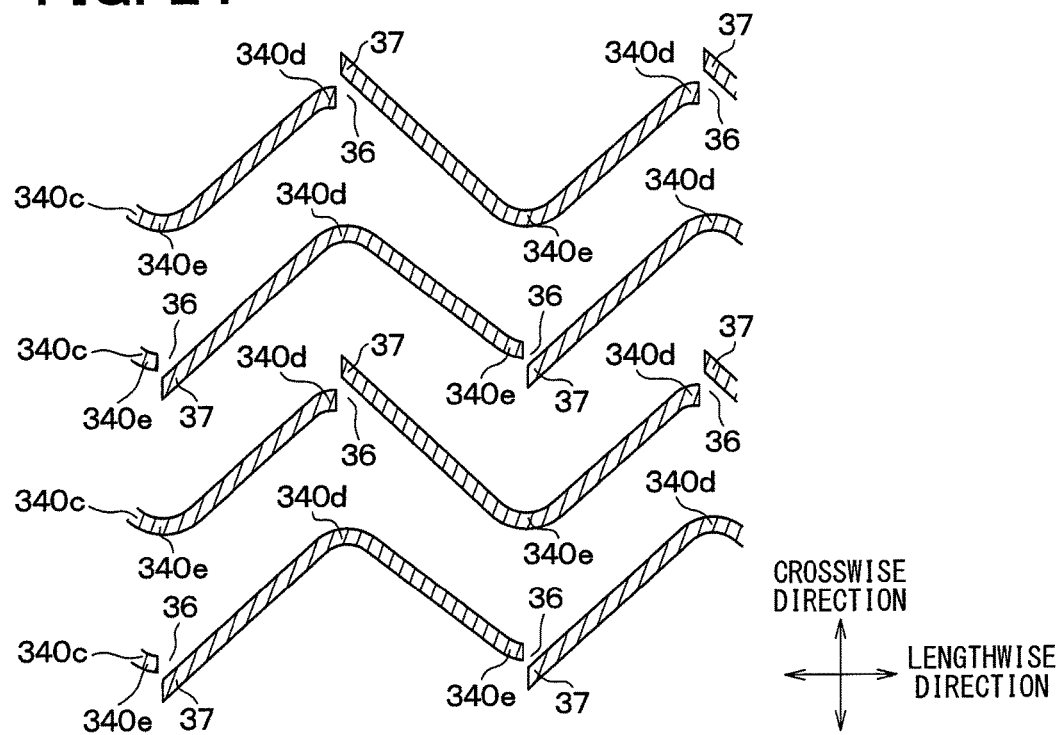
FIG. 24 is a cross-sectional view illustrating a position of a communication passage according to a modification of the embodiments of the present disclosure, and corresponds to FIG. 7.

In the second embodiment, the opening portion 36 is provided in the convex portion 340d and the concave portion 340e, but the opening portion 36 may be provided only at one of the convex portion 340d and the concave portion 340e. The opening portion 36 may be provided in both the convex portion 340d and the concave portion 340e, only at the convex portion 340d, or only at the concave portion 340e based on the wall surface portions 340c. For example, as shown in FIG. 24, the wall surface portion 340c in which the opening portion 36 is provided only at the convex portion 340d and the wall surface portion 340c in which the opening portion 36 is provided only at the concave portion 340e may be arranged alternately.

In the first embodiment, the flow passage pipe 3 includes the outer plates 31, 32, and the inner plate 33, but the flow passage pipe 3 may not include the inner plate 33. In addition, the flow passage pipe 3 may include only one inner fin 34.

In the first embodiment, the guide wall 37 protrudes into the region R3 to guide the heat medium to the region R4 of the adjacent narrow passage, but a part of the guide wall 37 may protrude into the R4 to guide the heat medium to the region R3 of the adjacent narrow passage. In this case, an area of a part (first portion) of the opening portion 36, through which the region R3 of one of the adjacent narrow passages into which the guide wall 37 protrudes is communicated with the region R4 of the other one of the adjacent narrow passages, is larger than an area of a part (second portion) of the opening portion 36, through which the region R4 of the one of the adjacent narrow passages is communicated with the region R3 of the other one of the adjacent narrow passages. That is, a cross-sectional area of the branched flow in the region R3 is larger than a cross-sectional area of the branched flow in the region R4, and a geometric center P of the branched flow is located in the region R3.

Figure 25:
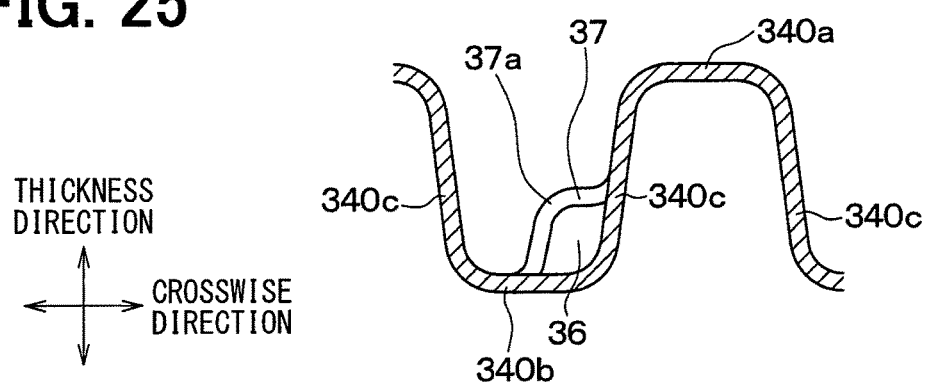
FIG. 25 is a cross-sectional view illustrating a wavy fin according to a modification of the embodiments of the present disclosure, and corresponds to FIG. 9.
Figure 26:
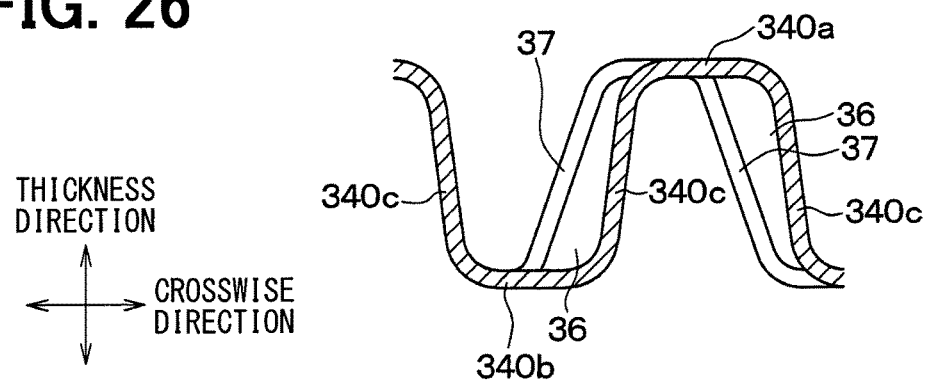
FIG. 26 is a cross-sectional view illustrating a wavy fin according to a modification of the embodiments of the present disclosure, and corresponds to FIG. 9.

The shapes of the opening portion 36 and the guide wall 37 may be changed from the first to fourth embodiments. Since the electronic component 2 is provided in the gap defined between two adjacent flow passage pipes 3 to constitute the stacking-type heat exchanger 1, a stress is exerted on the flow passage pipe 3 from an outside in the stacking direction. If the guide wall 37 is bent as shown in FIG. 25, for example, the stress is concentrated on a bent portion 37a, and accordingly the inner fin 34 and the flow passage pipe 3 is likely to be deformed. Accordingly, the opening portion 36 and the guide wall 37 may have a shape in which the stress is unlikely to concentrate on the guide wall 37, such that a strength of the guide wall 37 against buckling is high. For example, a cross-sectional shape of the opening portion 36 may be a triangular shape as in the first to fourth embodiments or a trapezoid shape as shown in FIG. 26, and a cross-sectional shape of the guide wall 37 in a direction perpendicular to the lengthwise direction of the flow passage pipe 3 may be a straight line shape connecting the crest portion 340a and the bottom portion 340b to each other.

Figure 27:
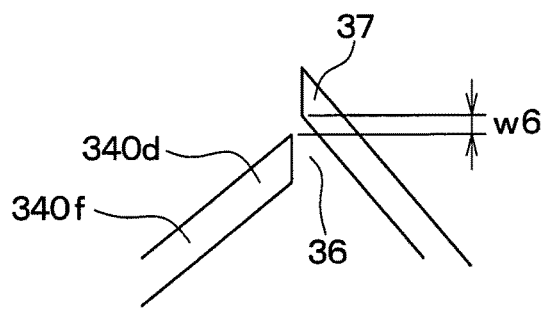
FIG. 27 is a cross-sectional diagram illustrating a narrow passage according to a modification of the embodiments of the present disclosure, and corresponds to FIG. 28.

In the second and fourth embodiments, shapes of the convex portion 340d and the concave portion 340e may be changed. For example, as shown in FIG. 27, in a cross-section perpendicular to the thickness direction of the flow passage pipe 3, parts of the convex portion 340d located on both sides of the opening portion 36 may be straight lines and constitute flat faces together with the intermediate portion 340f.

Figure 28:
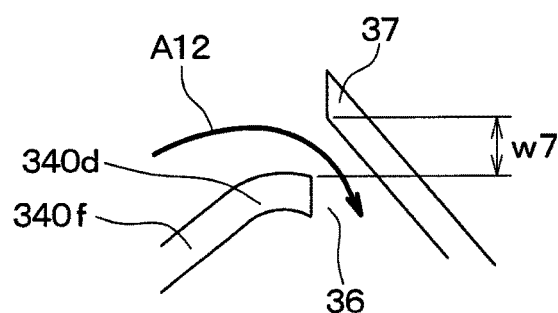
FIG. 28 is a diagram in which a part of FIG. 15 is enlarged.

In order to make the effects of the second and fourth embodiments greater, the heat medium may flow into the adjacent narrow passage smoothly. Accordingly, as in the second and fourth embodiments, in a cross-section perpendicular to the thickness direction of the flow passage pipe 3, a part extending from the intermediate portion 340f to an edge of the opening portion 36 opposite from and facing the guide wall 37 of the convex portion 340d may have a rounded shape convex to the side to which the convex portion 340d is convex. According to this, as indicated by arrows A12 in FIG. 28, the heat medium smoothly flows into the adjacent narrow passage. In the cross-section perpendicular to the thickness direction of the flow passage pipe 3, the part extending from the intermediate portion 340f to the edge of the opening portion 36 opposite from and facing the guide wall 37 of the concave portion 340e may have a rounded shape convex to the side to which the concave portion 340e is convex. In the cross-section perpendicular to the thickness direction of the flow passage pipe 3, the part extending from the intermediate portion 340f to the edge of the opening portion 36 opposite from and facing the guide wall 37 of the convex portion 340d may have a rounded shape convex to the first side in the crosswise direction. In the cross-section perpendicular to the thickness direction of the flow passage pipe 3, the part extending from the intermediate portion 340*f* to the edge of the opening portion 36 opposite from and facing the guide wall 37 of the concave portion 340*e* may have a rounded shape convex to the second side in the crosswise direction.

Moreover, in order to make the effects of the second and fourth embodiments greater, the width of the opening portion 36 may be large. In the second and fourth embodiments, since the parts extending from the convex portion 340*d* or the concave portion 340*e* to the intermediate portion 340*f* have a rounded shape, a width w7 of the opening portion 36 is larger than a width w6 of the opening portion shown in FIG. 27, and accordingly the above-described effects can be improved.

The above-described embodiments are not irrelevant to each other and may be combined with each other excepting a case where the combination is obviously impossible.

For example, the inner fin 34 may include the wall surface portion 340*c*, which includes the opening portion 36 and the guide wall 37 of the first embodiment, and the wall surface portion 340*c*, which includes the opening portion 36 and the guide wall 37 of the second embodiment. Moreover, one wall surface portion 340*c* may include the opening portion and the guide wall 37 of the first embodiment, and the opening portion 36 and the guide wall 37 of the second embodiment.

What is claimed is:

1. A heat exchanger comprising:
   a flow passage pipe that has a flat shape having a predetermined thickness, a heat medium flowing in the flow passage pipe, the heat medium exchanging heat with a heat exchange target; and
   an inner fin that is located inside the flow passage pipe, the inner fin increasing an area for heat transfer between the heat exchange target and the heat medium, wherein
   the inner fin includes
      a wavy fin which is one of a plurality of wavy fins that partitions a main passage into a plurality of partitioned passages, the heat medium flowing in the main passage, and
      a guide wall connected to the wavy fin,
   an x-direction is a lengthwise direction of the flow passage pipe,
   a z-direction is a thickness direction of the flow passage pipe,
   a y-direction is a direction perpendicular to both the x-direction and the z-direction,
   the wavy fin includes
      first convex portions that are curved toward a first side in the y-direction, and
      second convex portions that are curved toward a second side in the y-direction,
   the first convex portions and the second convex portions are arranged in alternating manner and interconnected by intermediate portions so as to have a wavy shape in cross-section perpendicular to the z-direction,
   the wavy fin has an opening portion through which two partitioned passages of the plurality of partitioned passages adjacent to each other across the wavy fin communicate with each other,
   the guide wall is connected to an edge of the wavy fin defining a downstream side of the opening portion in flow of the heat medium in one of the two partitioned passages, the guide wall protruding from the wavy fin into the one of the two partitioned passages, an end of the guide wall facing upstream in flow of the heat medium in the one of the two partitioned passages, or
   the guide wall is connected to an edge of the wavy fin defining an upstream side of the opening portion in flow of the heat medium in the one of the two partitioned passages, the guide wall protruding from the wavy fin into the one of the two partitioned passages, an end of the guide wall facing downstream in flow of the heat medium in the one of the two partitioned passages,
   a width in the y-direction of each of the plurality of partitioned passages varies in the z-direction,
   the each of the plurality of partitioned passages includes
      a first region in which the width in the y-direction is smaller than a predetermined width, and
      a second region in which the width in the y-direction is larger than the predetermined width,
   the opening portion is provided in at least two wavy fins of the plurality of wavy fins, and
   the opening portion provided in one of the two wavy fins has an opening which gradually enlarges in the z-direction while the opening portion provided in another of the two wavy fins has an opening which gradually enlarges in an opposite direction from the z-direction.

2. The heat exchanger according to claim 1, wherein the opening portion having the opening which gradually enlarges in the z-direction and the opening portion having the opening which gradually enlarges in the opposite direction from the z-direction are arranged in alternating manner in the y-direction.

3. The heat exchanger according to claim 1, wherein the opening of the opening portion gradually enlarges in the z-direction or the opposite direction from the z-direction, such that
   the heat medium flows from the first region of the one of the two partitioned passages into the second region of the other one of the two partitioned passages when the end of the guide wall faces upstream in flow of the heat medium, and
   the heat medium flows from the second region of the one of the two partitioned passages into the first region of the other one of the two partitioned passages when the end of the guide wall faces downstream in flow of the heat medium.

4. The heat exchanger according to claim 1, wherein the opening portion is provided in the second convex portion,
   the wavy fin includes a first continuous portion that includes
      one first convex portion,
      one intermediate portion directly connected to the one first convex portion,
      one second convex portion directly connected to the one intermediate portion, and
      the guide wall connected to the one second convex portion,
   a distance in the y-direction between a first outermost end in the y-direction and a second outermost end in the y-direction on a surface of the first continuous portion facing to the first side is defined as a distance d1,
   the wavy fin includes a second continuous portion that includes
      one first convex portion,
      one intermediate portion directly connected to the one first convex portion, and
      one second convex portion directly connected to the one intermediate portion,
   a distance in the y-direction between a first outermost end in the y-direction and a second outermost end in the y-direction on a surface of the second continuous portion facing to the first side is defined as a distance d2, and the guide wall protrudes in the y-direction from the wavy fin to the second side such that the distance d1 is larger than the distance d2.

5. The heat exchanger according to claim 4, wherein a part extending from the intermediate portion to an edge of the wavy fin that defines an opposite side of the opening portion of the second convex portion opposite from the guide wall has a rounded shape convex to the second side in the y-direction in cross-section perpendicular to the z-direction.

6. The heat exchanger according to claim 1, wherein the opening portion is provided in the first convex portion, the wavy fin includes a third continuous portion that includes
  one first convex portion,
  one intermediate portion directly connected to the one first convex portion,
  one second convex portion directly connected to the one intermediate portion, and
  the guide wall connected to the one first convex portion, a distance in the y-direction between a first outermost end in the y-direction and a second outermost end in the y-direction on a surface of the third continuous portion facing to the first side is defined as a distance d3, and the guide wall protrudes in the y-direction from the wavy fin toward the first side such that the distance d3 is larger than the distance d2.

7. The heat exchanger according to claim 6, wherein a part extending from the intermediate portion to an edge of the opening portion opposite from and facing the guide wall of the first convex portion has a rounded shape convex to the first side in the y-direction in cross-section perpendicular to the z-direction.

8. The heat exchanger according to claim 1, wherein the inner fin further includes
  a plurality of crest portions curved toward one side in the z-direction, and
  a plurality of bottom portions curved toward another side in the z-direction, and the plurality of the crest portions and the plurality of the bottom portions are arranged in alternating manner and interconnected by the plurality of wavy fins so as to have a wavy shape in cross-section perpendicular to the x-direction.

9. The heat exchanger according to claim 8, wherein the guide wall has a straight line shape connecting one of the plurality of crest portions and one of the plurality of bottom portions in cross-section perpendicular to the x-direction, and a length of a part of the opening portion defined by the guide wall is different in size than a length of a part of the opening portion defined by the inner fin.

10. The heat exchanger according to claim 1, wherein the flow passage pipe includes
  a pair of outer plates that face to each other, and
  an inner plate that is between the pair of outer plates and faces to the pair of outer plates, and the inner fin is disposed between the inner plate and one outer plate of the pair of outer plates.

11. The heat exchanger according to claim 1, wherein the inner fin has a plate shape.

12. A heat exchanger comprising:

a flow passage pipe that has a flat shape having a predetermined thickness, a heat medium flowing in the flow passage pipe, the heat medium exchanging heat with a heat exchange target; and an inner fin that is located inside the flow passage pipe, the inner fin increasing an area for heat transfer between the heat exchange target and the heat medium, wherein the inner fin includes
  a wavy fin which is one of a plurality of wavy fins that partition a main passage into a plurality of partitioned passages, the heat medium flowing in the main passage, and
  a guide wall connected to the wavy fin, an x-direction is a lengthwise direction of the flow passage pipe, a z-direction is a thickness direction of the flow passage pipe, a y-direction is a direction perpendicular to both the x-direction and the z-direction, the wavy fin includes
  a plurality of first convex portions that protrude in the y-direction to a first side of the flow passage pipe, and
  a plurality of second convex portions that protrude in the y-direction to a second side of the flow passage pipe, the plurality of first convex portions and the plurality of second convex portions are arranged in alternating manner such that the wavy fin has a wavy shape in cross-section perpendicular to the z-direction, the wavy fin includes an opening portion through which the two partitioned passages of the plurality of partitioned passages adjacent to each other across the wavy fin communicate with each other, the guide wall protrudes into the plurality of the partitioned passages from an edge of the wavy fin defining a downstream side or an upstream side of the opening portion in flow of the heat medium in the plurality of partitioned passages, a width in the y-direction of each of the plurality of partitioned passages varies in the z-direction, the each of the plurality of partitioned passages includes
  a first region in which the width in the y-direction is smaller than a predetermined width, and
  a second region in which the width in the y-direction is larger than the predetermined width, the opening portion is provided in at least two wavy fins of the plurality of wavy fins, and the opening portion provided in one of the two wavy fins has an opening which gradually enlarges in the z-direction while the opening portion provided in another of the two wavy fins has an opening which gradually enlarges in an opposite direction from the z-direction.

* * * * *